(12) United States Patent
Lee

(10) Patent No.: US 11,598,509 B2
(45) Date of Patent: Mar. 7, 2023

(54) BACKLIGHT UNIT

(71) Applicant: SEOUL SEMICONDUCTOR CO., LTD., Gyeonggi-do (KR)

(72) Inventor: Chung Hoon Lee, Gyeonggi-do (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 88 days.

(21) Appl. No.: 17/117,330

(22) Filed: Dec. 10, 2020

(65) Prior Publication Data

US 2021/0095833 A1 Apr. 1, 2021

Related U.S. Application Data

(63) Continuation of application No. 16/895,248, filed on Jun. 8, 2020, now Pat. No. 10,948,163, and a
(Continued)

(30) Foreign Application Priority Data

| Dec. 8, 2017 | (KR) | 10-2017-0168249 |
| Jan. 22, 2018 | (KR) | 10-2018-0007751 |
| Dec. 7, 2018 | (KR) | 10-2018-0157216 |

(51) Int. Cl.
*F21V 13/00* (2006.01)
*F21V 13/08* (2006.01)
(Continued)

(52) U.S. Cl.
CPC ............. *F21V 13/08* (2013.01); *F21V 3/12* (2018.02); *F21V 7/04* (2013.01); *F21V 7/24* (2018.02);
(Continued)

(58) Field of Classification Search
CPC ........ F21V 9/30; F21V 7/04; G02F 1/133603; G02F 1/05; G02F 1/06; H01L 33/60
See application file for complete search history.

(56) References Cited

U.S. PATENT DOCUMENTS

2011/0305003 A1* 12/2011 Lee ................... G02B 6/0073
362/97.1
2015/0241004 A1* 8/2015 Oberschmid .......... F21K 9/64
362/235
(Continued)

FOREIGN PATENT DOCUMENTS

| CN | 102313204 A | 1/2012 |
| JP | 2012003263 A | 1/2012 |

(Continued)

OTHER PUBLICATIONS

Office Action from corresponding Chinese Patent Application No. 2022110902060940 dated Nov. 14, 2022 (7 pages).

*Primary Examiner* — Gerald J Sufleta, II
(74) *Attorney, Agent, or Firm* — Perkins Coie LLP

(57) ABSTRACT

The present invention relates to a backlight unit for use in a display device. The backlight unit includes a circuit board, at least one light-emitting diode chip mounted on the circuit board, a plurality of reflection members arranged on the upper part of the light-emitting diode chip, and a light diffusing member. The light diffusing member has an incident surface on which light enters and an emitting surface from which light is emitted. The light diffusing member is arranged on the upper part of the circuit board. The plurality of reflection members are stacked on each other and reflect a part of light emitted from the upper surface of the light-emitting diode chip.

18 Claims, 15 Drawing Sheets

Related U.S. Application Data continuation of application No. PCT/KR2018/015599, filed on Dec. 10, 2018.

(51) Int. Cl.

| | | |
|---|---|---|
| *F21V 7/24* | (2018.01) | |
| *F21V 9/30* | (2018.01) | |
| *F21V 3/12* | (2018.01) | |
| *H01L 33/60* | (2010.01) | |
| *H01L 25/075* | (2006.01) | |
| *H01L 33/50* | (2010.01) | |
| *F21V 7/04* | (2006.01) | |
| *G02F 1/13357* | (2006.01) | |
| *F21Y 105/16* | (2016.01) | |
| *F21Y 115/10* | (2016.01) | |
| *H01L 33/32* | (2010.01) | |
| *H01L 33/06* | (2010.01) | |
| *H01L 33/12* | (2010.01) | |
| *H01L 33/14* | (2010.01) | |
| *H01L 33/42* | (2010.01) | |
| *H01L 33/46* | (2010.01) | |
| *G02F 1/1335* | (2006.01) | |

(52) U.S. Cl.
CPC .......... *F21V 9/30* (2018.02); *G02F 1/133603* (2013.01); *G02F 1/133605* (2013.01); *G02F 1/133606* (2013.01); *H01L 25/0753* (2013.01); *H01L 33/505* (2013.01); *H01L 33/60* (2013.01); *F21Y 2105/16* (2016.08); *F21Y 2115/10* (2016.08); *G02F 1/133614* (2021.01); *H01L 33/06* (2013.01); *H01L 33/12* (2013.01); *H01L 33/14* (2013.01); *H01L 33/32* (2013.01); *H01L 33/42* (2013.01); *H01L 33/46* (2013.01); *H01L 33/502* (2013.01)

(56) References Cited

U.S. PATENT DOCUMENTS

| | | | |
|---|---|---|---|
| 2016/0087159 A1* | 3/2016 | Kim | H01L 33/46 |
| | | | 257/98 |
| 2016/0133810 A1* | 5/2016 | Jung | H01L 33/32 |
| | | | 257/13 |
| 2016/0349445 A1* | 12/2016 | Kim | H01L 33/56 |
| 2017/0103972 A1* | 4/2017 | Yamada | F21V 9/08 |
| 2017/0186921 A1* | 6/2017 | Kim | H01L 33/504 |
| 2018/0180250 A1* | 6/2018 | Yamada | H01L 33/60 |
| 2018/0182940 A1* | 6/2018 | Yamamoto | H01L 33/46 |

FOREIGN PATENT DOCUMENTS

| | | |
|---|---|---|
| KR | 20170001436 A | 1/2017 |
| KR | 1020170001436 A | 1/2017 |
| KR | 1020170075897 A | 7/2017 |

\* cited by examiner

BACKLIGHT UNIT

CROSS-REFERENCE TO RELATED APPLICATIONS AND PRIORITY

This application is a continuation of U.S. patent application Ser. No. 16/895,248, filed on Jun. 8, 2020, which is a continuation of International Patent Application No. PCT/KR2018/015599, filed on Dec. 10, 2018 and claims priority from and the benefit of Korean Patent Application No. 10-2017-0168249, filed on Dec. 8, 2017, Korean Patent Application No. 10-2018-0007751, filed on Jan. 22, 2018, and Korean Patent Application No. 10-2018-0157216, filed on Dec. 7, 2018, each of which are incorporated by reference for all purposes as if fully set forth herein.

TECHNICAL FIELD

Embodiments of the present disclosure relate to a backlight unit.

BACKGROUND

A display device may be a non-emissive device and further does not include a self-light emitting source. Then, a display device requires a separate light source capable of illuminating the entirety of a screen at the backside thereof. A lighting device for such a display device is referred to as a backlight unit.

In general, backlight units are classified into an edge type backlight unit and a direct type backlight unit according to an arrangement location of light sources, such as light emitting diode (LED) chips.

In the edge type backlight unit, the light sources are disposed at a side of a light diffusing member adapted to guide light. However, since the edge type backlight unit includes LED chips disposed along a side surface of the light diffusing member, there is a limit in thickness reduction of a bezel of a display device. In addition, the edge type backlight unit does not allow individual operation of the LED chips connected in series on a circuit board.

In the direct type backlight unit, the light sources are disposed under the light diffusing member to illuminate a front side of a display panel. However, since the direct type backlight unit includes light emitting diode chips disposed under the light diffusing member, there is a limit in thickness reduction of the backlight unit and the display device.

Therefore, there is a need to provide a backlight unit enabling thickness reduction of a display device. There is also a need to provide a backlight unit enabling local dimming and thickness reduction of a display device. Furthermore, there is a need to provide a backlight unit having improved luminous efficacy through reduction in distance between a light diffusing member and a light emitting diode chip.

SUMMARY

In accordance with one embodiment of the present disclosure, a backlight unit includes a circuit board, at least one light emitting diode chip mounted on the circuit board, multiple reflective members mounted on the light emitting diode chip, and a light diffusing member. The light diffusing member has a light incident surface on which light is incident and a light exit surface through which light is emitted, and is disposed on an upper surface of the circuit board. The reflective members are stacked and reflect some fraction of light emitted through an upper surface of the light emitting diode chip. In addition, the light incident surface of the light diffusing member covers a side surface of the light emitting diode chip and side and upper surfaces of the reflective members.

In a backlight unit according to embodiments of the present disclosure, cavities are formed on a light diffusion member and light emitting diode chips are disposed in the cavities of the light diffusion member, thereby enabling thickness reduction of the backlight unit.

In the backlight unit according to the embodiments of the present disclosure, light emitting diode chips are uniformly arranged on the overall light diffusion member, thereby enabling thickness reduction and local dimming.

BRIEF DESCRIPTION OF DRAWINGS

FIG. 1 is a top view of the backlight unit according to the first embodiment of the present disclosure;

FIG. 2 is a side view of the backlight unit, in which a light diffusing member is separated from light emitting diode chips; and FIG. 3 is a sectional view of the backlight unit shown in FIG. 1.

FIG. 10 is a sectional view of a backlight including a light diffusing member;

FIG. 11 illustrates a method for forming the light diffusing member as shown in FIG. 10 including preparing light emitting diode chips mounted on a circuit board.

FIG. 12 illustrates depositing a light diffusing resin on an upper surface of the circuit board in the method for forming the light diffusing member.

FIG. 13 illustrates flattening a cured light diffusing resin in the method for forming the light diffusing member.

DETAILED DESCRIPTION OF EMBODIMENTS

Figure 1:
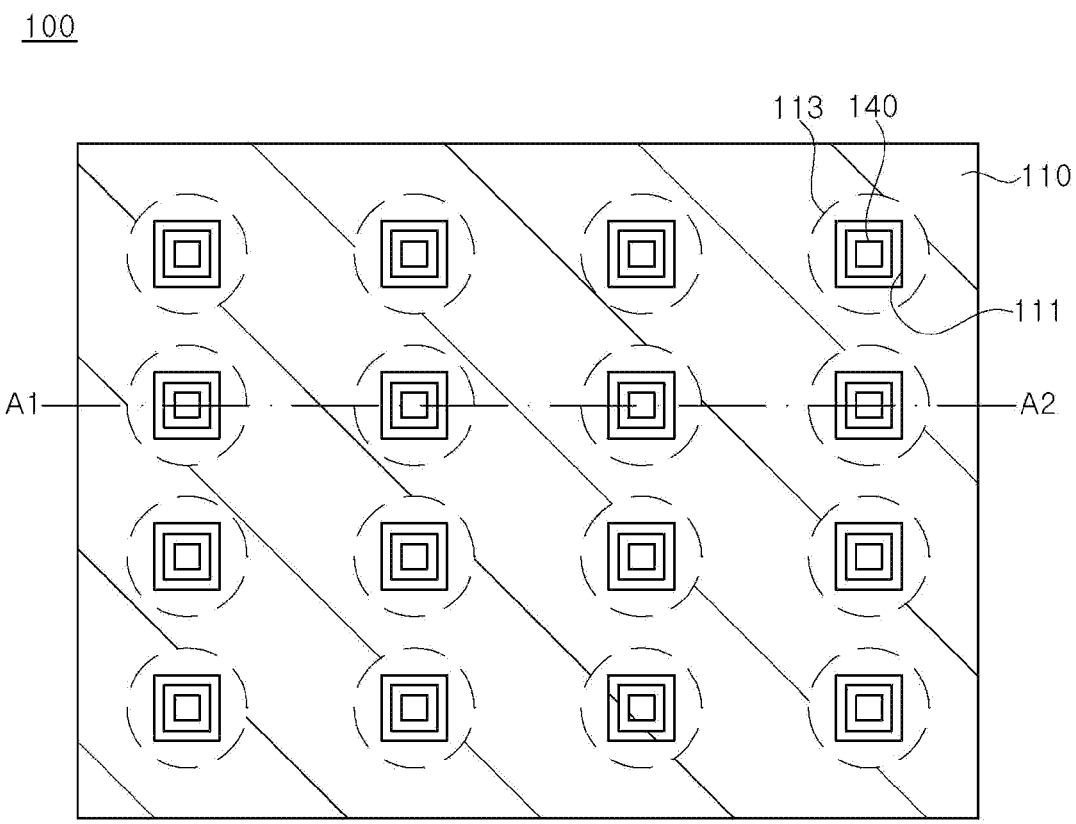
FIGS. 1-3 are exemplary views of a backlight unit according to a first embodiment of the present disclosure, where.

Hereinafter, embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements or components can be exaggerated for clarity and descriptive purposes. Throughout the specification, like reference numerals denote like components having the same or similar functions.

A backlight unit according to one embodiment of the present disclosure includes a circuit board, at least one light emitting diode chip mounted on the circuit board, multiple reflective members mounted on the light emitting diode chip, and a light diffusing member. The light diffusing member has a light incident surface on which light is incident and a light exit surface through which light is emitted, and is disposed on an upper surface of the circuit board and. The reflective members are stacked and reflect some fraction of light emitted through an upper surface of the light emitting diode chip. In addition, the light incident surface of the light diffusing member covers a side surface of the light emitting diode chip and side and upper surfaces of the reflective members.

The multiple reflective members may have different areas from one another. For example, the multiple reflective members are disposed to have gradually decreasing areas with increasing distance from the upper surface of the light emitting diode chip.

The multiple reflective members may be distributed Bragg reflectors (DBRs). Alternatively, the multiple reflective members may be formed of a metal.

At least one of the multiple reflective members may be formed of a different material than other reflective members.

At least one of the multiple reflective members may have a different thickness than other reflective members.

The multiple reflective members may be formed of a light transmitting resin containing a reflective material.

According to one embodiment, the light incident surface of the light diffusing member may closely contact the side surface of the light emitting diode chip and the side and upper surfaces of the reflective members.

The backlight unit may further include a wavelength conversion member.

For example, the wavelength conversion member may cover the side and upper surfaces of the light emitting diode chip. Here, the light incident surface of the light diffusing member may closely contact a side surface of the wavelength conversion member and the side and upper surfaces of the reflective members.

Alternatively, the wavelength conversion member may cover the side surface of the light emitting diode chip and the side and upper surfaces of the reflective members. Here, the light incident surface of the light diffusing member may closely contact side and upper surfaces of the wavelength conversion member.

The light exit surface of the light diffusing member may be flat.

The light exit surface of the light diffusing member may further include a convex portion protruding upwards. Here, the convex portion may be disposed on each of the light emitting diode chips.

The light incident surface of the light diffusing member may have a different radius of curvature than the light exit surface thereof.

The light incident surface of the light diffusing member may have a different refractive index than the light exit surface thereof.

According to another embodiment, the light incident surface of the light diffusing member may be spaced apart from the side surface of the light emitting diode chip and the side and upper surfaces of the reflective members.

The backlight unit may further include a sealing member disposed between a combination of the light emitting diode chip and the reflective members and the light incident surface of the light diffusing member.

The backlight unit may further include a reflective sheet disposed at a lower side of the light diffusing member.

The backlight unit may further include a light diffusing material dispersed in the light diffusing member.

The backlight unit may further include a light diffusion sheet disposed on the light diffusing member.

The backlight unit may further include a wavelength conversion sheet disposed on the light diffusing member.

Hereinafter, embodiments of the present disclosure will be described in detail.

Figure 2:
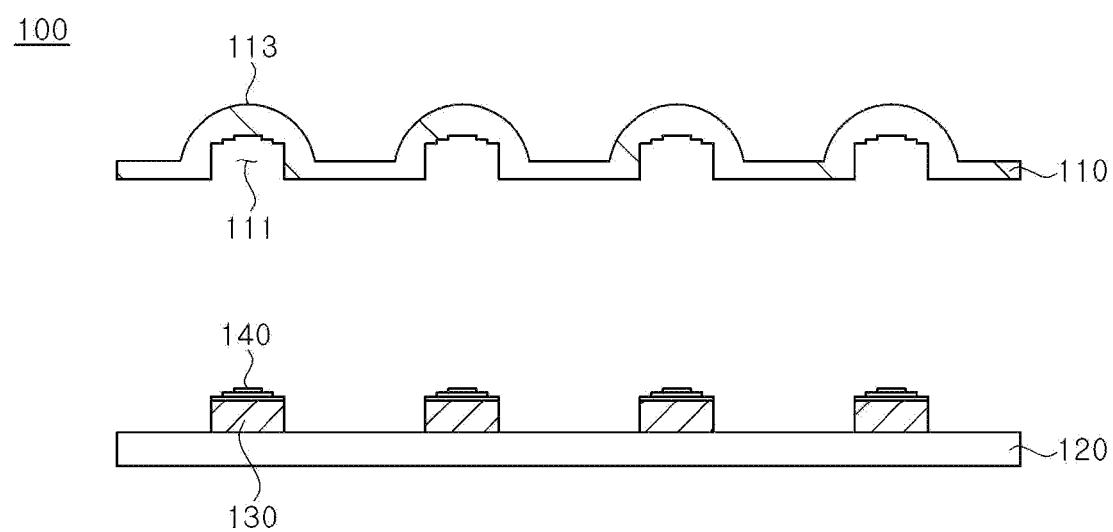
Figure 3:
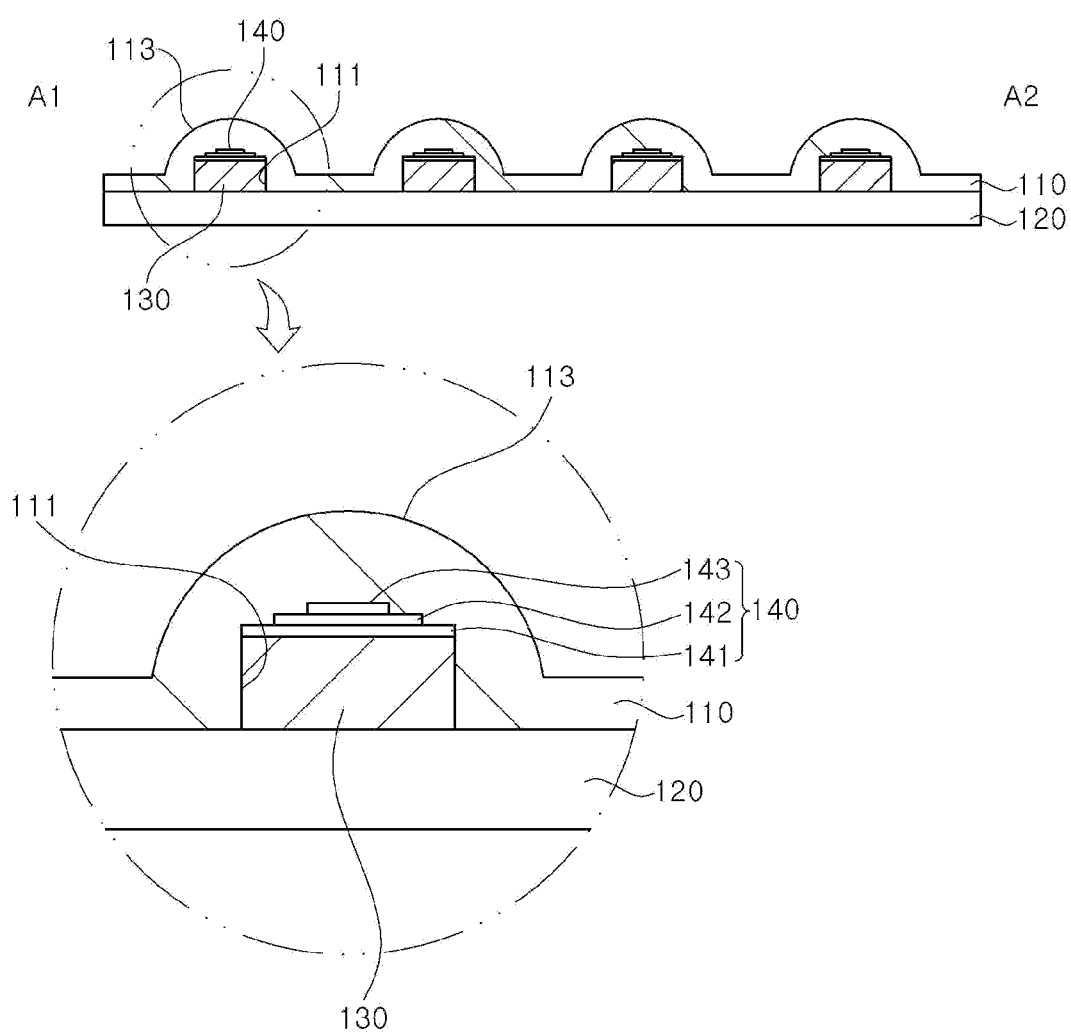

FIG. 1 to FIG. 3 are exemplary views of a backlight unit according to a first embodiment of the present disclosure.

FIG. 1 is a top view of a backlight unit 100 according to the first embodiment of the present disclosure. FIG. 2 is a side view of the backlight unit 100, in which a light diffusing member 110 is separated from light emitting diode chips 130, and FIG. 3 is a sectional view of the backlight unit shown in FIG. 1.

Referring to FIG. 1, the backlight unit 100 according to the first embodiment includes a light diffusing member 110, a circuit board 120, light emitting diode chips 130, and reflective members 140.

The light diffusing member 110 is formed of a transparent material. For example, the light diffusing member 110 may include one material selected from among acrylic resins, such as poly(methyl methacrylate) (PMMA), polyethylene terephthalate (PET), polycarbonate (PC), and polyethylene naphthalate (PEN) resins.

According to this embodiment, the light diffusing member 110 is formed on a lower surface thereof with at least one cavity 111. Although the cavity 111 is formed on the lower surface of the light diffusing member 110, the cavity 111 does not reach an upper surface of the light diffusing member 110 as shown in FIG. 2. In addition, the cavity 111 has a structure corresponding to each light emitting diode chip 130 and the reflective member 140 disposed inside the light diffusing member 110.

The cavity 111 of the light diffusing member 110 receives the light emitting diode chip 130 and the reflective member 140 disposed on an upper surface of the light emitting diode chip 130 therein.

Although not illustrated in this embodiment, the backlight unit 100 includes optical sheets disposed on the light diffusing member 110 to spread or collect light.

The light diffusing member 110 is provided at a lower side thereof with the circuit board 120 on which the light emitting diode chips 130 are mounted. The circuit board 120 is electrically connected to the light emitting diode chips 130 to supply electric power to the light emitting diode chips 130 such that the light emitting diode chips 130 emit light.

As shown in FIGS. 2-3, the light diffusing member 110 has a convex portion 113 on the upper surface thereof. The convex portion 113 is a portion of the upper surface of the light diffusing member 110, which protrudes in an upward direction. For example, the convex portion 113 has a semispherical structure. The convex portion 113 is disposed on an upper surface of the light emitting diode chip 130. Referring to FIG. 3, the convex portion 113 surrounds the upper and side surfaces of the light emitting diode chip 130. In addition, the convex portion 113 is formed to surround each of the light emitting diode chips 130. An inner surface of the light diffusing member 113 corresponding to the cavities 111 is a light incident surface on which light emitted from the light emitting diode chips 130 is incident. Further, the upper surface of the light diffusing member 113 is a light exit surface through which light is discharged.

The light exit surface of the light diffusing member 110 is composed of a flat surface and a curved surface constituting the convex portion 113. As shown in FIG. 2, the light incident surface of the light diffusing member 110 has a different radius of curvature than the light exit surface thereof.

According to this embodiment, light emitted from each of the light emitting diode chips 130 is primarily scattered to spread broadly through refraction when passing through the light incident surface of the light diffusing member 110, which has an inwardly concave shape. In addition, when light having entered the light diffusing member 110 is discharged from the light diffusing member 110, the light is secondarily scattered through refraction by the structure of the convex portion 113. That is, the light is evenly spread above the light diffusing member 110 by the structure of the light incident surface of the light diffusing member 110, which is concave into the light diffusing member 110, and by the convex portion 113 of the light diffusing member 110, which is convex in an upward direction thereof. Since light is discharged from the light diffusing member 110 while being evenly spread in the convex portion 113, light emitted from the convex portions 113 intersects each other in a space between adjacent convex portions 113. Accordingly, the backlight unit 100 can prevent generation of dark spots at an upper portion in a space between the light emitting diode chips 130 because the light diffusing member 110 includes the inwardly concave light incident surface and the light exit surface having the convex portion 113.

The convex portion 113 provides a radius of curvature to the light exit surface of the light diffusing member 110, thereby suppressing total reflection of light on the light exit surface. The backlight unit 100 suppresses total reflection of light, thereby improving light extraction efficiency. The light emitting diode chip 130 is mounted on the circuit board 120 to be placed in the cavity 111 of the light diffusing member 110. In the structure where the light diffusing member 110 is formed with multiple cavities 111, the light emitting diode chip 130 may be disposed in each of the cavities 111, as shown in FIG. 3.

According to this embodiment, the light emitting diode chip 130 is configured to emit light through upper and side surfaces thereof. The structure of the light emitting diode chip 130 will be described in detail below.

According to this embodiment, the side surface of the light emitting diode chip 130 closely contacts the light incident surface constituting the cavity 111 of the light diffusing member 110. Light emitted from the side surface of the light emitting diode chip 130 is directly incident on the light incident surface of the light diffusing member 110. Here, the light emitted from the side surface of the light emitting diode chip 130 is light generated in an active layer (not shown) of the light emitting diode chip 130 and having passed directly through the side surface of the light emitting diode chip 130, or light having passed through the side surface of the light emitting diode chip 130 after being reflected by the reflective members 140.

The reflective member 140 is formed in a single layer or in multiple layers on the upper surface of each of the light emitting diode chips 130. For example, first to third reflective members 141 to 143 are sequentially stacked on the upper surface of the light emitting diode chip 130.

According to this embodiment, the second reflective member 142 having a smaller area than the first reflective member 141 is disposed on an upper surface of the first reflective member 141. For example, the first reflective member 141 may be formed to cover the entirety of the upper surface of the light emitting diode chip 130. Here, the second reflective member 142 is disposed in a region of the first reflective member 141. Further, the third reflective member 143 having a smaller area than the second reflective member 142 is disposed on an upper surface of the second reflective member 142. Here, the third reflective member 143 is disposed in a region of the second reflective member 142.

With this structure, the first to third reflective members 141 to 143 serve to reflect some fraction of light emitted through the upper surface of the light emitting diode chip 130 such that the reflected light enters the light incident surface of the light diffusing member 110, that is, the inner surface of the light diffusing member 110 constituting the cavity 111.

According to this embodiment, upper and side surfaces of the reflective members 140 closely contact the inner surface of the light diffusing member 110 constituting the cavity 111. Light having passed through the reflective member 140 is incident on the inner surface of the light diffusing member 110, which closely contacts the reflective member 140.

Light having passed through the side surface of the light emitting diode chip 130 and light reflected by the first to third reflective members 141 to 143 enter the inner surface of the light diffusing member 110, specifically an inner side surface of the light diffusing member 110, which closely contacts the side surface of the light emitting diode chip 130. Further, light having passed through the reflective member 140 enters an inner upper surface of the light diffusing member 110 closely contacting the reflective member 140.

The first to third reflective members 141 to 143 may have different reflectivity depending on materials, thicknesses and areas thereof. Accordingly, the quantity of light traveling towards the inner side surface of the light diffusing member 110 may be regulated through regulation of the reflectivity of the first to third reflective members 141 to 143. Here, the inner side surface of the light diffusing member 110 refers to a portion of the light diffusing member 110, which closely contacts the side surface of the light emitting diode chip 130 and a side surface of the first reflective member 141. Accordingly, the ratio of light emitted through the upper surface of the light diffusing member 110 after passing through the inner side surface of the light diffusing member 110 to light emitted through the upper surface of the light diffusing member 110 after passing through the inner upper surface of the light diffusing member 110 may be regulated by regulating reflectivity of each of the first to third reflective members 141 to 143. Furthermore, using the reflective member 140, the overall uniformity of light emitted through the entirety of the light exit surface of the light diffusing member 110 may be regulated by regulating the ratio of light emitted through the flat light exit surface of the light diffusing member 110 to light emitted through the light exit surface of the light diffusing member 110 corresponding to the convex portion 113.

The first to third reflective members 141 to 143 may be formed of any material capable of reflecting at least some fraction of light. Each of the first to third reflective members 141 to 143 may be a distributed Bragg reflector (DBR). For example, the DBR may be constituted by a single layer formed of one of $SiO_2$, $TiO_2$, SiN, and TiN. Alternatively, the DBR may have a structure wherein at least two layers of $SiO_2$, $TiO_2$, SiN and TiN are stacked once or repeatedly one above another. Alternatively, the first to third reflective members 141 to 143 may be formed of a metal, such as Ag, Al, and the like. Alternatively, some of the first to third reflective members 141 to 143 may be formed of a metal and the other reflective member may be constituted by the DBR. Although the reflective member is illustrated as having a triple-layer structure in this embodiment, it should be understood that the number of reflective members may be changed according to thickness, material and luminous quantity of the reflective member.

In the backlight unit 100 according to this embodiment, the light diffusing member 110, the light emitting diode chip 130 emitting light, and the reflective member 140 are disposed to closely contact each other. Accordingly, light emitted from the light emitting diode chip 130 and the reflective member 140 directly reaches the light diffusing member 110 without passing through other media.

In some embodiments, the light diffusing member 110 may be formed by injection molding. The light diffusing member 110 may be formed by injecting a material into a mold designed to have the cavities constituted by the inner surface thereof corresponding to the structure of the light emitting diode chips 130 and the reflective members 140, followed by compression. The light emitting diode chips 130 and the reflective members 140 may be inserted into the cavities 111 of the light diffusing member 110. Here, since each of the cavities 111 has a structure corresponding to the light emitting diode chip 130 and the reflective member 140, the light emitting diode chips 130 and the reflective members 140 may be secured to the corresponding cavities of the light diffusing member 110.

Since the light emitting diode chips are arranged along a side surface of the light diffusing member in a conventional edge type backlight unit, the conventional edge type backlight unit may not significantly reduce the thickness of the display device. Moreover, the multiple light emitting diode chips mounted on the circuit board are generally connected in series, and therefore, the conventional edge type backlight unit does not allow individual operation of the light emitting diode chips.

Moreover, since the light emitting diode chips are disposed under the light diffusing member in a conventional direct type backlight unit, the direct type backlight unit may have a limit in the thickness reduction of the backlight unit and the display device.

However, in the backlight unit 100 according to this embodiment, the light emitting diode chips 130 are disposed in the cavities 111 inside the light diffusing member 110 instead of being disposed under the light diffusing member 110, thereby making possible the thickness reduction of the backlight unit 100 and a display device including the same. In addition, the backlight unit 100 according to this embodiment can realize local dimming to allow individual control of the light emitting diode chips 130 through the circuit board 120. Further, in the backlight unit 100 according to this embodiment, the reflectivity of the reflective member 140 can be easily controlled based on the size of the reflective member 140, the number of layers in the reflective member 140, the material of the reflective member 140, and the like. Accordingly, the backlight unit 100 according to this embodiment allows easy control of light emission such that light emitted through the upper surface of the light diffusing member 110 and light emitted upwards through the cavities have a uniformity of 90% or more. Furthermore, the backlight unit 100 allows uniform light emission, and therefore, a display device (not shown) including the backlight unit 100 can minimize generation of spots.

Furthermore, in the backlight unit 100 according to this embodiment, the surfaces of the light emitting diode chips 130 through which light is emitted, the surfaces of the reflective members 140, and the surface of the light diffusing member 110 closely contact each other. With this structure, the backlight unit 100 can prevent the reflection of light at an interface between different media and light loss due to a separation distance between the light exit surface and the light incident surface of the light diffusing member 110, thereby improving light extraction efficiency and uniformity of light on the upper surface of the light diffusing member 110.

Figure 4:
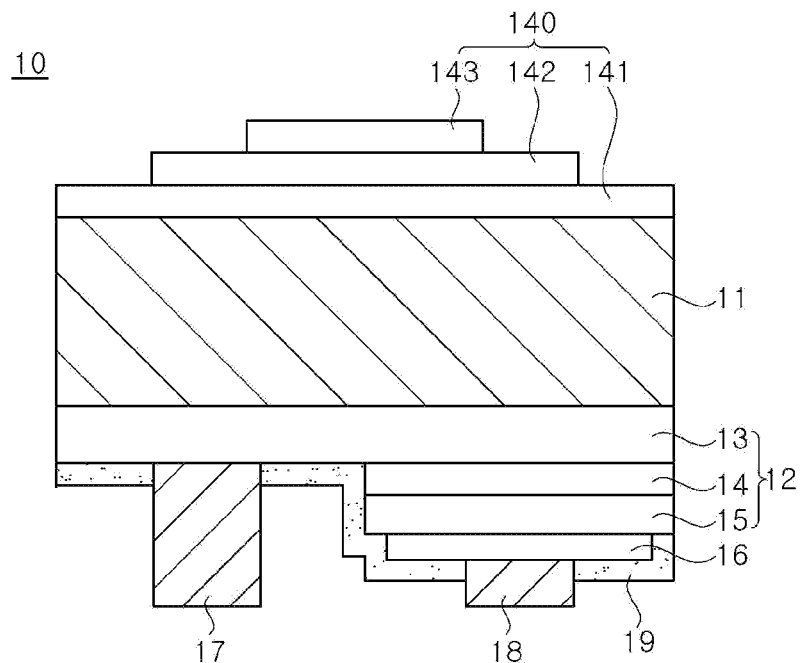
FIG. 4 is a sectional view of a light emitting diode chip and a reflective member according to a second embodiment of the present disclosure.

FIG. 4 is a sectional view of a light emitting diode chip and a reflective member according to a second embodiment of the present disclosure.

A light emitting diode chip 10 according to this embodiment is used as the light emitting diode chip 130 of the backlight unit 100 (see FIG. 1 to FIG. 3). The light emitting diode chip 10 has a lateral structure in which positive and negative electrodes are formed at a lower side thereof.

Referring to FIG. 4, the light emitting diode chip 10 includes a substrate 11, a light emitting structure 12, a transparent electrode layer 16, a first electrode pad 17, a second electrode pad 18, and a reflective layer 19.

The substrate 11 may be selected from any transparent substrates without limitation. For example, the substrate 11 may be a sapphire substrate or a SiC substrate. Alternatively, the substrate 11 may be a growth substrate suitable for growth of gallium nitride-based compound semiconductor layers, like a patterned sapphire substrate (PSS).

The light emitting structure 12 is disposed at a lower side of the substrate 11. The light emitting structure 12 includes a first conductivity type semiconductor layer 13, a second conductivity type semiconductor layer 15, and an active layer 14 interposed between the first conductivity type semiconductor layer 13 and the second conductivity type semiconductor layer 15. Here, the first conductivity type and the second conductivity type are opposite to each other, and may be an n-type and a p-type, respectively, or vice versa.

In some embodiments, the first conductivity type semiconductor layer 13, the active layer 14 and the second conductivity type semiconductor layer 15 may be formed of gallium nitride-based compound semiconductor materials. Referring to FIG. 4, each of the first conductivity type semiconductor layer 13 and the second conductivity type semiconductor layer 15 may be composed of a single layer. Alternatively, at least one of the first conductivity type semiconductor layer 13 and the second conductivity type semiconductor layer 15 may have a multilayer structure. The active layer 14 may have a single quantum well structure or a multi-quantum well structure. Although not shown in FIG. 4, a buffer layer may be formed between the substrate 11 and the first conductivity type semiconductor layer 13.

The first conductivity type semiconductor layer 13, the second conductivity type semiconductor layer 15 and the active layer 14 may be formed by Metal Organic Chemical Vapor Deposition (MOCVD) or Molecular Beam Epitaxy (MBE). In addition, the second conductivity type semiconductor layer 15 and the active layer 14 may be patterned by photolithography and etching so as to expose some regions of the first conductivity type semiconductor layer 13. Here, the first conductivity type semiconductor layer 13 may also be partially patterned.

The transparent electrode layer 16 is disposed on a lower surface of the second conductivity type semiconductor layer 15. For example, the transparent electrode layer 16 may be formed of ITO, ZnO or Ni/Au. The transparent electrode layer 16 has lower specific resistance than the second conductivity type semiconductor layer 15 and can spread electric current.

The first electrode pad 17 is disposed at a lower side of the first conductivity type semiconductor layer 13 and the second electrode pad 18 is disposed at a lower side of the transparent electrode layer 16. The second electrode pad 18 is electrically connected to the second conductivity type semiconductor layer 15 through the transparent electrode layer 16.

The reflective layer 19 is formed to cover the lower side of the light emitting structure 12 excluding the first electrode pad 17 and the second electrode pad 18. In addition, the reflective layer 19 is formed to cover side surfaces of the active layer 14 and the second conductivity type semiconductor layer 15 exposed by patterning for exposing the first conductivity type semiconductor layer 13.

With this structure, the reflective layer 19 reflects light, which is generated from the active layer 14 and travels towards the second electrode pad 18, such that the light travels to upper and side surfaces of the light emitting diode chip 10. As a result, the reflective layer 19 allows the entirety of light generated from the light emitting structure 12 to be emitted only through a light emitting surface of the light emitting diode chip 10.

The reflective layer 19 may be an insulation layer constituted by a single layer or multilayer DBR or may be a metal layer surrounded by the insulation layer. The location and structure of the reflective layer 19 are not limited to the location and structure shown in FIG. 4. The location and structure of the reflective layer 19 may be changed in various ways so long as the reflective layer 19 can reflect light traveling towards the second electrode pad 18.

The first to third reflective members 141 to 143 are disposed on the upper surface of the light emitting diode chip 10.

The first reflective member 141 is disposed on an upper surface of the substrate 11 of the light emitting diode chip 10. Here, the first reflective member 141 may be formed to cover the entirety of the upper surface of the substrate 11. If the first reflective member 141 is formed to have a smaller area than the substrate 11, light can be directly emitted only through a portion of the substrate 11, which is exposed to the outside, thereby providing a substantial difference in quantity of light with other portions of the substrate or the light diffusing member.

The second reflective member 142 is disposed on the upper surface of the first reflective member 141. The second reflective member 142 has a smaller area than the first reflective member 141, as shown in FIG. 4. In addition, the third reflective member 143 is disposed on the upper surface of the second reflective member 142. The third reflective member 143 has a smaller area than the second reflective member 142, as shown in FIG. 4. The arrangement and sizes shown in FIG. 4 are by way of one example and the present disclosure may not be limited thereto.

Some fraction of light having passed through the upper surface of the light emitting diode chip 10 is reflected by the first reflective member 141. Other fraction of the light passes through the first reflective member 141. Here, among the light having passed through the first reflective member 141, some is discharged and the rest of the light travels towards the second reflective member 142. Among the light having passed through the first reflective member 141 and reaching the second reflective member 142, some of the light is reflected by the second reflective member 142 and the other fraction of the light passes through the second reflective member 142. Again, among the light having passed through the second reflective member 142, some is discharged and the other fraction of the light travels towards the third reflective member 143. Among the light having passed through the second reflective member 142 and reaching the third reflective member 143, some is reflected by the third reflective member 143 and the other fraction of the light passes through the third reflective member 143. In this way, the quantity of light emitted through the upper and side surfaces of the light emitting diode chip 10 may be regulated through the first to third reflective members 141 to 143 having different areas.

Further, when the reflective member disposed on the upper surface of the light emitting diode chip 10 has a structure of multiple layers having the gradually decreasing areas instead of a single layer structure, more accurate regulation of luminous intensity can be achieved through regulation of reflectivity of each layer using the material, thickness, etc. of each layer.

Although not shown in FIG. 4, ohmic contact layers may be placed between the first conductivity type semiconductor layer 13 and the first electrode pad 17 and between the second conductivity type semiconductor layer 15 and the second electrode pad 18.

Figure 5:
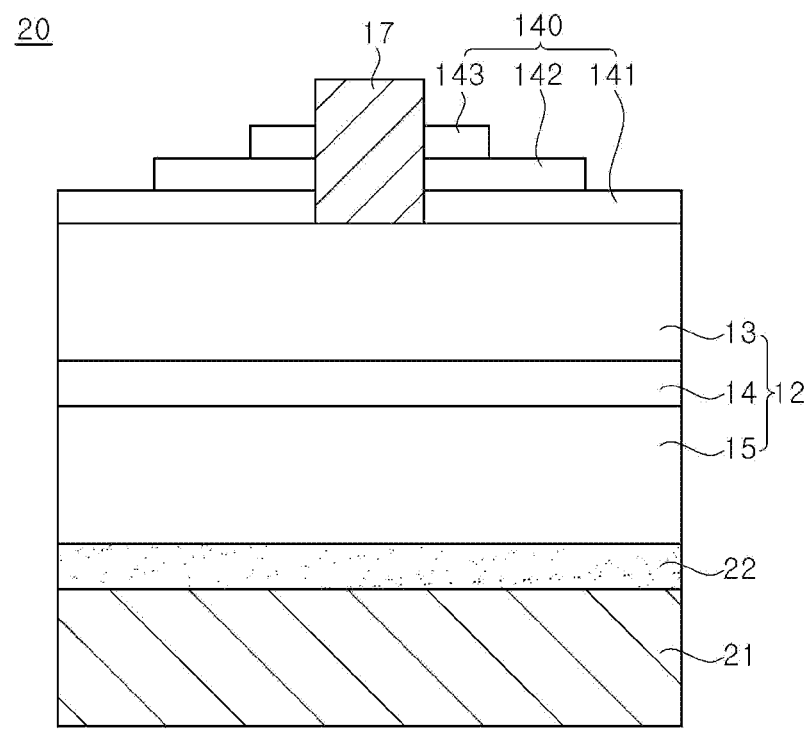
FIG. 5 is a sectional view of a light emitting diode chip and a reflective member according to a third embodiment of the present disclosure.

FIG. 5 is a sectional view of a light emitting diode chip and a reflective member according to a third embodiment of the present disclosure.

A light emitting diode chip 20 may be used as the light emitting diode chip 130 of the backlight unit 100 (see FIG. 1 to FIG. 3). The light emitting diode chip 20 has a vertical structure where electrodes are formed on upper and lower sides of the light emitting diode chip, respectively.

In describing the light emitting diode chip 20, the description of the same components of the light emitting diode chip 20 as those of the light emitting diode chip 10 according to the second embodiment (see FIG. 4) may be omitted. For the omitted description of the components, the description of FIG. 4 can be referred.

Referring to FIG. 5, the light emitting diode chip 20 may include a conductive substrate 21, a light emitting structure 12, a first electrode pad 17, and a reflective layer 22.

The conductive substrate 21 serves not only to support the light emitting structure 12, but also to act as a second electrode pad through electric connection to the second conductivity type semiconductor layer 15.

The light emitting structure 12 is disposed on an upper surface of the conductive substrate 21. The light emitting structure 12 has a structure where the second conductivity type semiconductor layer 15, the active layer 14 and the first conductivity type semiconductor layer 13 are sequentially stacked on the upper surface of the conductive substrate 21, as shown in FIG. 5.

The reflective layer 22 is formed between the conductive substrate 21 and the second conductivity type semiconductor layer 15 to reflect light generated from the active layer 14 and emitted towards the conductive substrate 21. The reflective layer 22 may be formed of a conductive material to electrically connect the conductive substrate 21 to the second conductivity type semiconductor layer 15. The reflective layer 22 may also act as an ohmic contact layer between the conductive substrate 21 and the second conductivity type semiconductor layer 15.

The first electrode pad 17 is formed in some region on the first conductivity type semiconductor layer 13. An ohmic contact layer may be formed between the first conductivity type semiconductor layer 13 and the first electrode pad 17.

The first to third reflective members 141 to 143 may be formed on an upper surface of the first conductivity type semiconductor layer 13 excluding the region of the first conductivity type semiconductor layer 13 in which the first electrode pad 17 is formed.

Each of the first to third reflective members 141 to 143 may be a DBR. If the first to third reflective members 141 to 143 are formed of a metal, an insulation layer is further formed in order to insulate the first electrode pad 17 from the first conductivity type semiconductor layer 13. Alternatively, the first electrode pad 17 may be omitted and the first to third reflective members 141 to 143 may act as the first electrode pad 17.

As such, the quantity of light emitted through the upper and side surfaces of the light emitting diode chip 20 can be easily controlled by the first to third reflective members 141 to 143. In addition, if the first to third reflective members 141 to 143 act as the first electrode pad 17, the first electrode pad 17 can be omitted. Thus, the light emitting diode chip 20 according to this embodiment has a simple structure while allowing control of the light emission location thereof and the quantity of light emitted therefrom.

With reference to FIG. 4 and FIG. 5, exemplary structures of the reflective member 140 formed on the lateral and vertical type light emitting diode chips are illustrated. However, it should be understood that the structure of the light emitting diode chip according to the present disclosure is not limited to those shown in FIG. 4 and FIG. 5. The light emitting diode chip may have any structure so long as the light emitting diode chip allows wire bonding and flip-chip bonding. In addition, the reflective member 140 may be formed at any location of the light emitting diode chip 130, which requires control of the quantity of light emitted therefrom.

Further, various structures of light emitting diode chips to which the reflective member 140 is applied may be also applied to other embodiments of the backlight unit.

In the following description of various embodiments, the components described in the above embodiments will be omitted or briefly described. Therefore, for details of the briefly described or omitted components, refer to the above embodiments.

Figure 6:
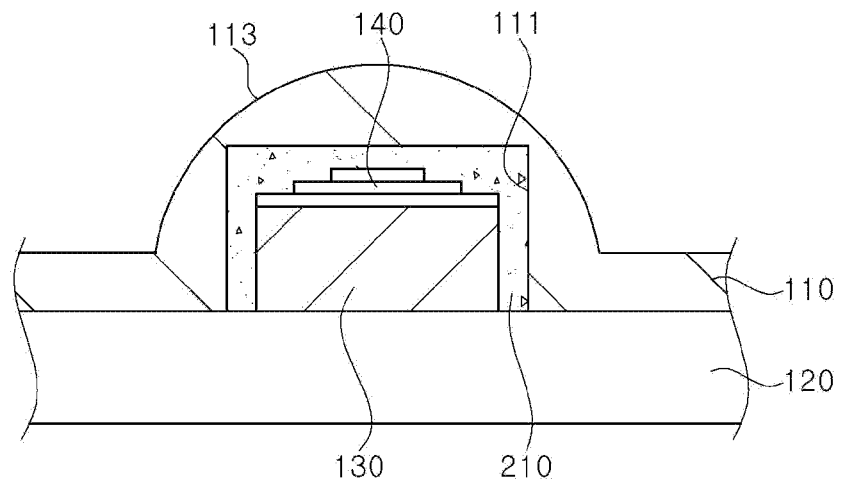
FIG. 6 is a sectional view of a backlight unit according to a fourth embodiment of the present disclosure.

FIG. 6 is a sectional view of a backlight unit 200 according to a fourth embodiment of the present disclosure. Referring to FIG. 6, a backlight unit 200 includes a light diffusing member 110, a circuit board 120, light emitting diode chips 130, reflective members 140, and wavelength conversion members 210.

The backlight unit 200 according to the second embodiment includes the wavelength conversion member 210, which surrounds the light emitting diode chip 130 and the reflective member 140. Here, the inner surface of the light diffusing member 110 constituting cavities 111 has a structure corresponding to the wavelength conversion member 210 and closely contacts the wavelength conversion member 210. Accordingly, light emitted through the wavelength conversion member 210 and subjected to wavelength conversion directly enters the light diffusing member 110.

The wavelength conversion member 210 emits white light or certain color light through conversion of wavelengths of light emitted from the light emitting diode chip 130. The wavelength conversion member 210 may be formed of a transparent resin containing phosphors for converting the wavelengths of light. For example, the transparent resin may be a transparent silicone resin. The phosphors may include yellow phosphors, red phosphors, and green phosphors.

Examples of the yellow phosphors may include silicate phosphors or YAG:Ce ($T_3Al_5O_{12}$:Ce) phosphors, which are cerium-doped yttrium (Y) aluminum (Al) garnets having a main wavelength of 530 nm to 570 nm.

Examples of the red (R) phosphors may include nitride phosphors or YOX ($Y_2O_3$:Eu) phosphors having a main wavelength of 611 nm and composed of a compound of yttrium oxide ($Y_2O_3$) and europium (Eu).

An example of the green (G) phosphors may include LAP ($LaPO_4$:Ce,Tb) phosphors having a main wavelength of 544 nm and composed of a compound of phosphoric acid ($PO_4$), lanthanum (La) and terbium (Tb).

An example of the blue (B) phosphors may include BAM ($BaMgAl_{10}O_{17}$:Eu) phosphors having a main wavelength of 450 nm and composed of a compound of barium (Ba), magnesium (Mg) and aluminum oxide materials and europium (EU).

The phosphors may include fluoride compound KSF ($K_2SiF_6$) phosphors, which are $Mn^{4+}$-activated phosphors advantageous for high color reproduction.

As such, the wavelengths of light emitted through the side surface of the light emitting diode chip 130 and light having passed through the reflective member 140 can be converted by the wavelength conversion member 210, which surrounds the light emitting diode chip 130 and the reflective member 140.

Figure 7:
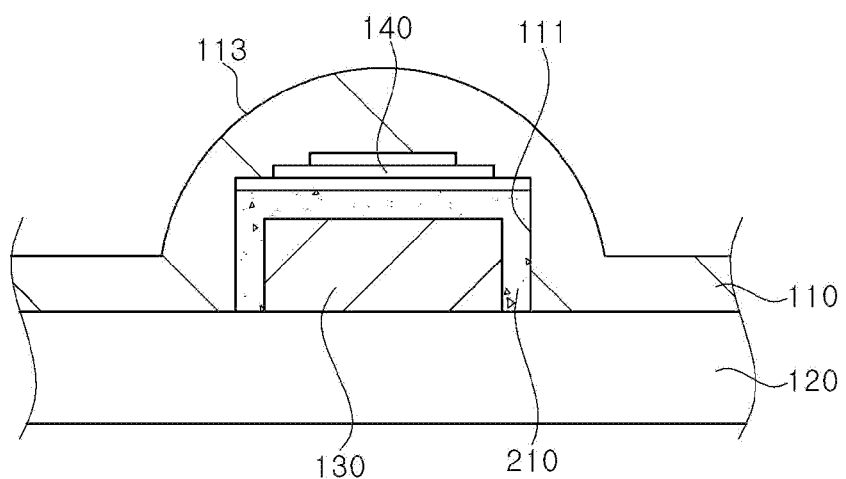
FIG. 7 is a sectional view of a backlight unit according to a fifth embodiment of the present disclosure.

FIG. 7 is a sectional view of a backlight unit according to a fifth embodiment of the present disclosure. Referring to FIG. 7, a backlight unit 300 includes a light diffusing member 110, a circuit board 120, light emitting diode chips 130, reflective members 140, and wavelength conversion members 210. The backlight unit 300 includes the wavelength conversion members 210 each surrounding the light emitting diode chip 130.

In this embodiment, the wavelength conversion member 210 is formed to surround side and upper surfaces of the light emitting diode chip 130. Here, the lowermost layer of the reflective member 140 may be formed to cover the entirety of an upper surface of the wavelength conversion member 210. Thus, an inner side surface of the light diffusing member 110 closely contacts a side surface of the wavelength conversion member 210 and an inner upper surface of the light diffusing member 110 closely contacts the reflective member 140.

Light emitted through the side surface of the light emitting diode chip 130 is subjected to wavelength conversion and travels towards the light diffusing member 110. In addition, light emitted through the upper surface of the light emitting diode chip 130 is subjected to wavelength conversion and travels towards the reflective member 140. That is, since light reflected by the reflective member 140 is subjected to wavelength conversion on the upper surface of the light emitting diode chip 130, there is no need for wavelength conversion of the light on the side surface of the light emitting diode chip 130. Thus, since there is no need for consideration of reflection of light by the reflective member 140 when the light is emitted through the wavelength conversion member 210 at the side surface of the light emitting diode chip 130, there is no need for increase in the content of the phosphors in the wavelength conversion member 210 or in thickness of the wavelength conversion member 210. That is, the wavelength conversion member 210 can achieve overall uniform conversion of light through regulation of thicknesses of the upper and side surfaces thereof in consideration of light emitted through the upper and side surface of the light emitting diode chip 130.

Figure 8:
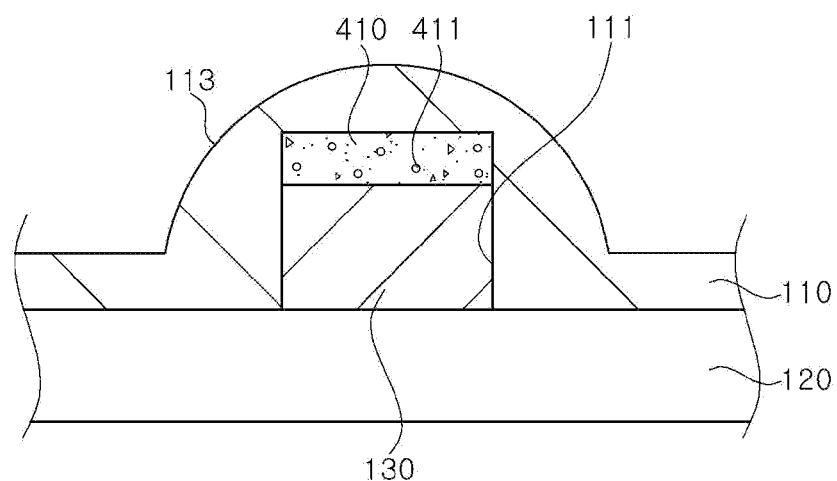
FIG. 8 is a sectional view of a backlight unit according to a sixth embodiment of the present disclosure.

FIG. 8 is a sectional view of a backlight unit according to a sixth embodiment of the present disclosure. Referring to FIG. 8, a backlight unit 400 includes a light diffusing member 110, a circuit board 120, light emitting diode chips 130, and reflective members 410.

According to this embodiment, the reflective member 410 may be formed of a light transmitting resin containing a reflective material 411. The light transmitting resin of the reflective member 410 may be selected from well-known materials in the art, such as a silicone resin, an epoxy resin, and the like. For example, the light transmitting resin of the reflective member 410 may be a silicone resin having a reflectivity difference of 10% or less with the light diffusing member 110.

The reflective member 410 is disposed on an upper surface of the light emitting diode chip 130. Accordingly, the inner surface of the light diffusing member 110 closely contacts a side surface of the light emitting diode chip 130, a side surface of the reflective member 410 and an upper surface of the reflective member 410. According to this embodiment, light emitted through the upper surface of the light emitting diode chip 130 is reflected by the reflective material 411 to enter the inner surface of the light diffusing member 110 while passing through the light transmitting layer.

According to this embodiment, the reflective member 410 allows control of the quantity of light emitted through the upper surface thereof or through the side surface of the light emitting diode chip 130 by regulating the content of the reflective material 411.

Figure 9:
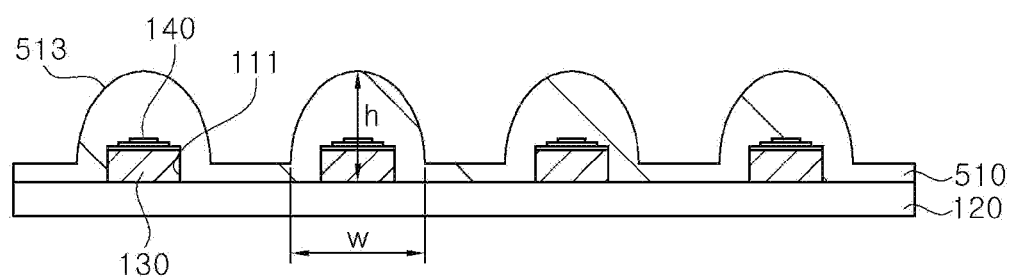
FIG. 9 is a sectional view of a backlight unit according to a seventh embodiment of the present disclosure.

FIG. 9 is a sectional view of a backlight unit according to a seventh embodiment of the present disclosure.

Referring to FIG. 9, a backlight unit 500 according to the seventh embodiment includes a light diffusing member 510, a circuit board 120, light emitting diode chips 130, and reflective members 140.

According to this embodiment, the light diffusing member 510 includes a convex portion 513 having a curved surface instead of a spherical shape. For example, the convex portion 513 has a parabolic structure that has a greater height than a width w in a cross-section thereof, as shown in FIG. 9. With such a parabolic structure, the convex portion 513 has different radii of curvature at light emission locations thereof.

The convex portion 513 has a larger area than a convex portion having a semi-spherical structure. That is, with the convex portion 513 of the parabolic structure, the light exit surface of the light diffusing member 510 has a larger area.

For example, as the height of the convex portion 513 increases with reference to the width of the convex portion 513 in a cross-section thereof, light is refracted at different angles through a larger area of the convex portion 513, thereby allowing light to be more broadly scattered. Accordingly, light broadly scattered by the light incident surface of the light diffusing member 510 can be more broadly scattered through the larger area of the convex portion 513 of the parabolic structure.

In the backlight unit 500 according to this embodiment, the convex portion 513 of the parabolic structure scatters light more broadly, whereby light emitted through adjacent convex portions 513 can be more efficiently mixed with light emitted through the light exit surface between the convex portions 513. Further, the backlight unit 500 according to this embodiment allows control of the quantity of light emitted in upward and lateral directions of the light emitting diode chips 130 by the reflective members 140.

As such, the backlight unit 500 can improve uniformity of light emitted through the light exit surface of the light diffusing member 510 by the convex portions 513 of the parabolic structure and the reflective members 140.

Figure 10:
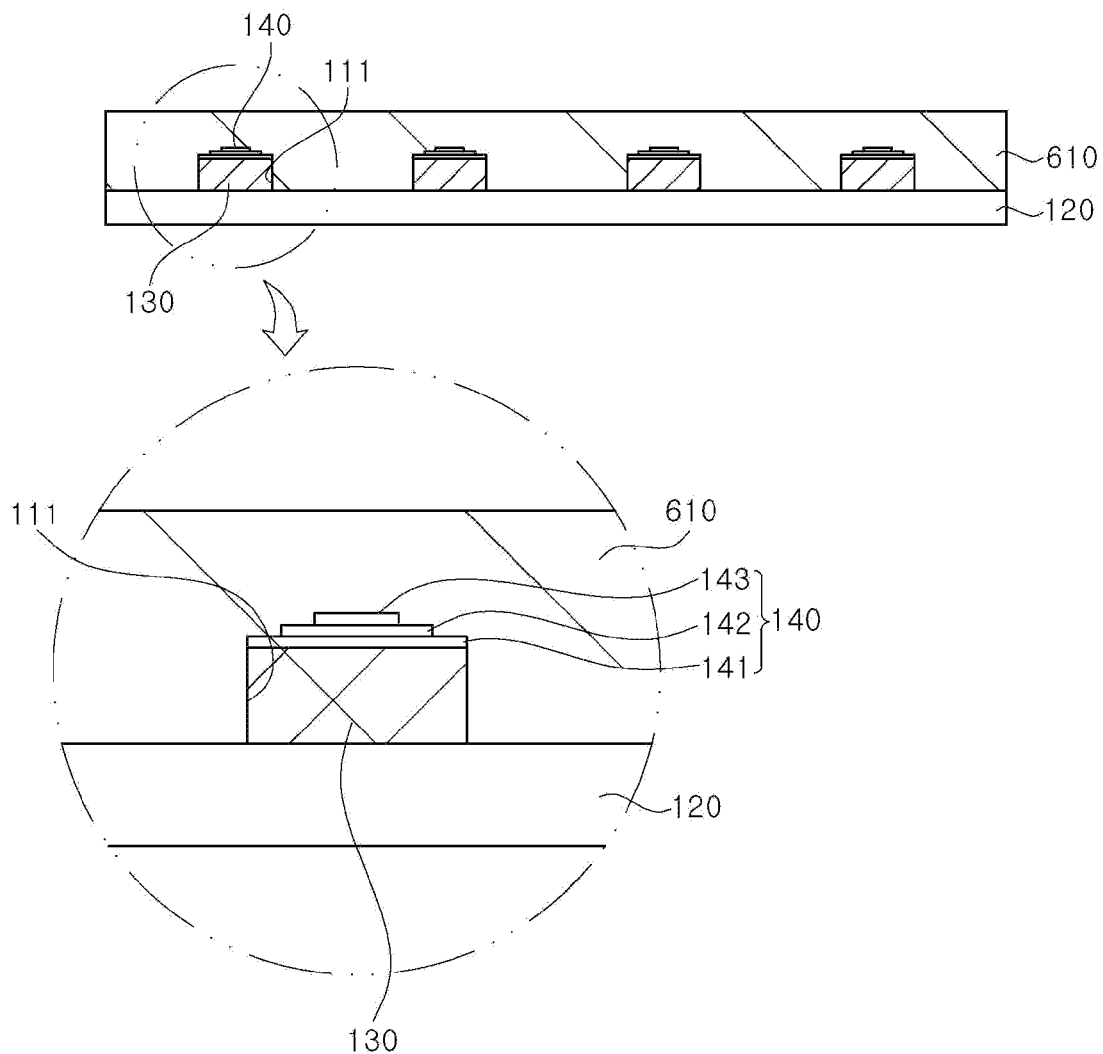
FIG. 10 to FIG. 13 are exemplary views of a backlight unit according to an eighth embodiment of the present disclosure, where.

FIG. 10 to FIG. 13 are exemplary views of a backlight unit according to an eighth embodiment of the present disclosure. Referring to FIG. 10, a backlight unit 600 includes a light diffusing member 610, a circuit board 120, light emitting diode chips 130, and reflective members 140.

According to this embodiment, the light exit surface of the light diffusing member 610 has a flat structure. Thus, the light diffusing member 610 according to this embodiment may be manufactured by a simple process of flattening an upper surface thereof without the step of molding the light diffusing member to have a separate structure and a process corresponding thereto. A light diffusing member having a separate structure requires a mold corresponding to the structure of the light diffusing member, whereas the light diffusing member 610 according to this embodiment does not require a separate mold. Further, since the light diffusing member 610 according to this embodiment has a flat upper surface, the light diffusing member 610 may be formed by any simple process of flattening the upper surface thereof even when manufactured using a mold having any structure.

In addition, the light diffusing member 610 may be formed by other methods instead of injection molding using a mold.

Figure 11:
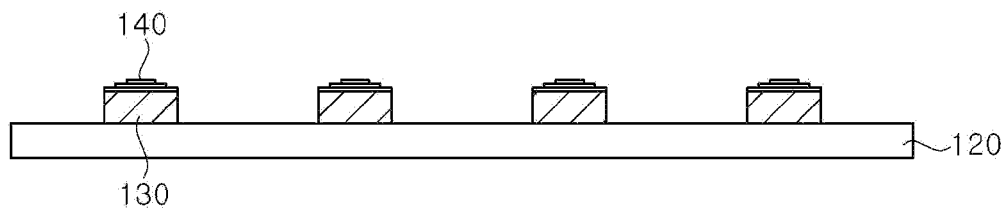
Figure 12:
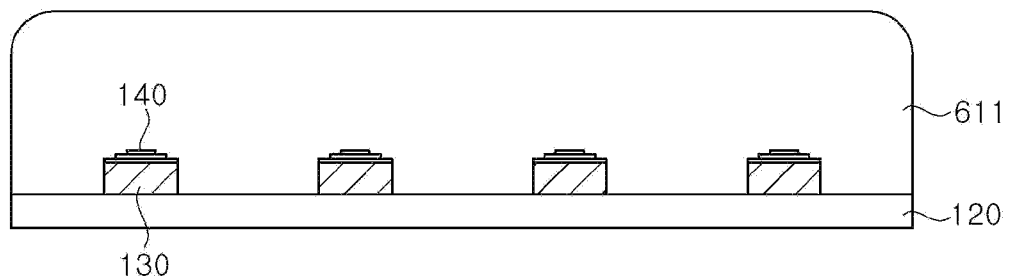
Figure 13:
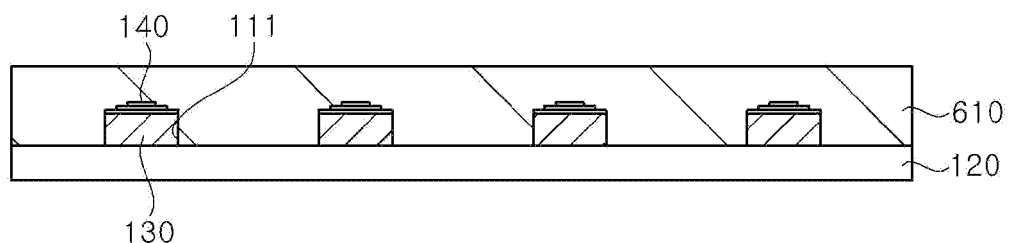

FIG. 11 through FIG. 13 illustrate a method for forming the light diffusing member 610. FIG. 11 illustrates a method for forming the light diffusing member as shown in FIG. 10 including preparing light emitting diode chips mounted on a circuit board.

FIG. 12 illustrates depositing a light diffusing resin on an upper surface of the circuit board in the method for forming the light diffusing member. FIG. 13 illustrates flattening a cured light diffusing resin in the method for forming the light diffusing member. Referring to FIG. 11, a circuit board 120 and light emitting diode chips 130 mounted on the circuit board 120 and each having a reflective member 140 thereon are prepared.

Thereafter, as shown in FIG. 12, a light diffusing resin 611 is deposited on an upper surface of the circuit board 120. The light diffusing resin 611 is deposited to cover the light emitting diode chips 130 and the reflective members 140. For example, the light diffusing resin 611 may be a silicone resin. The light diffusing resin 611 deposited on the circuit board 120 is cured. Thereafter, the cured light diffusing resin 611 is subjected to a flattening process, thereby providing a light diffusing member 610 having a flat upper surface, as shown in FIG. 13.

With this structure, the backlight unit 600 is manufactured by a simpler process with reduced manufacturing costs than backlight units including other light diffusing members having a flat upper surface and a separate structure.

Further, in the backlight unit 600 according to this embodiment, although the light exit surface of the light diffusing member 610 corresponding to the upper surface thereof has a flat structure, the light incident surface of the light diffusing member has an inwardly concave structure and thus allows light scattering thereon. Accordingly, the backlight unit 600 allows uniform emission of light through the overall region of the light exit surface of the light diffusing member 610.

Figure 14:
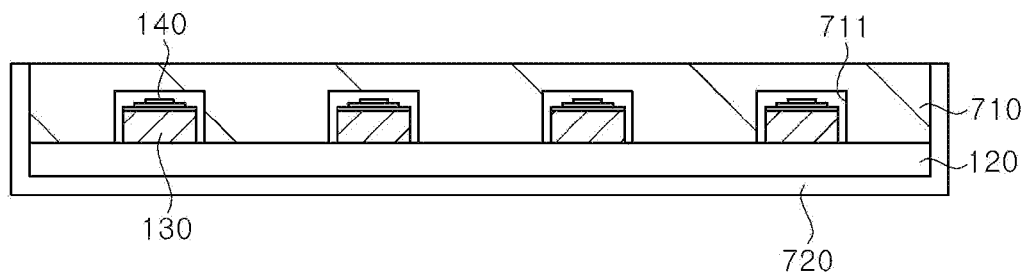
FIG. 14 is a sectional view of a backlight unit according to a ninth embodiment of the present disclosure.

FIG. 14 is a sectional view of a backlight unit according to a ninth embodiment of the present disclosure. Referring to FIG. 14, a backlight unit 700 includes a housing 720, a light diffusing member 710, a circuit board 120, light emitting diode chips 130, and reflective members 140.

The housing 720 is open at an upper side thereof and receives the light emitting diode chips 130, the reflective members 140 and the light diffusing member 710 therein. The housing 720 may be formed of a reflective material or may have an inner wall coated with the reflective material. With this structure, light emitted through lower and side surfaces of the light diffusing member 710 is reflected by the inner wall of the housing 720 to reenter the light diffusing member 710, thereby improving luminous efficacy of the backlight unit 700. The backlight units according to the above embodiments also include the housing 720.

According to this embodiment, the light diffusing member 710 includes cavities 711 having a rectangular cross-section. In addition, the cavities 711 of the light diffusing member 710 are formed to have a larger size than the light emitting diode chips 130 and the reflective members 140. That is, each of the cavities 711 of the light diffusing member 710 has a greater width than the light emitting diode chip 130 and a greater height than a length from a lower surface of the light emitting diode chip 130 to an upper surface of the reflective member 140.

In the backlight unit 700 according to this embodiment, although the light diffusing member 710 covers the light emitting diode chips 130 and the reflective members 140, empty spaces are formed between the light incident surface of the light diffusing member 710 and combinations of the light emitting diode chips 130 and the reflective members 140.

According to this embodiment, the cavities 711 of the light diffusing member 710 have a simple structure of a rectangular cross-section. Accordingly, the light diffusing member 710 can be easily manufactured.

Further, since the cavity 711 of the light diffusing member 710 has a larger size than the light emitting diode chip 130 and the reflective member 140, the backlight unit 700 can prevent the light emitting diode chips 130 and the reflective members 140 from being damaged by the light diffusing member 710. On the contrary, the backlight unit 700 can prevent the light diffusing member 710 from being damaged by the light emitting diode chip 130 and the reflective member 140. That is, when the light diffusing member 710 covers the light emitting diode chips 130 and the reflective members 140, the backlight unit 700 can prevent the inner walls (light incident surfaces) of the cavities 711 of the light diffusing member 710 from colliding with the light emitting diode chips 130 or the reflective members 140.

Figure 15:
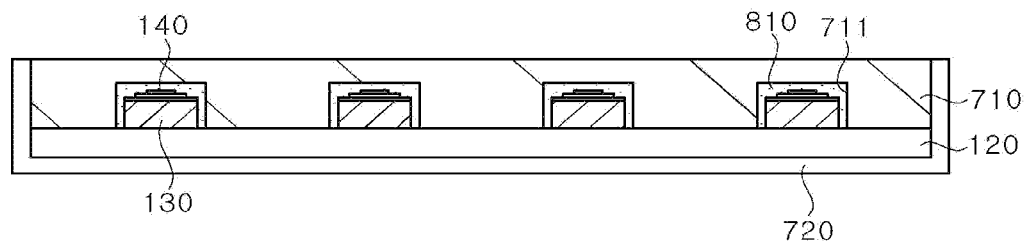
FIG. 15 is a sectional view of a backlight unit according to a tenth embodiment of the present disclosure.

FIG. 15 is a sectional view of a backlight unit according to a tenth embodiment of the present disclosure. Referring to FIG. 15, a backlight unit 800 includes a housing 720, a light diffusing member 710, a circuit board 120, light emitting diode chips 130, reflective members 140, and sealing members 810.

According to this embodiment, each of the sealing members 810 is formed between a combination of the light emitting diode chip 130 and the reflective member 140 and the light diffusing member 710. That is, the sealing members 810 are formed to cover the light emitting diode chips 130 and the reflective members 140 on the circuit board 120. The sealing members 810 can enhance bonding strength between the circuit board 120 and the light diffusing member 710.

For example, the sealing members 810 may be formed of a light transmitting resin well-known in the art, such as a silicone resin, an epoxy resin, and the like. In addition, the sealing members 810 may be formed of a material having a similar refractive index to the light diffusing member 710. When the sealing member 810 is formed of a material having a similar refractive index to the light diffusing member 710, it is possible to minimize reflection of light, which is emitted from the light emitting diode chip 130 and travels towards the light diffusing member 710, at an interface between the light diffusing member 710 and the sealing member 810.

Figure 16:
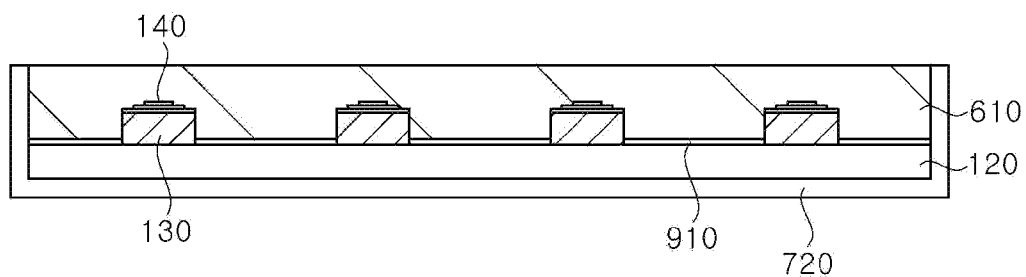
FIG. 16 is a sectional view of a backlight unit according to a eleventh embodiment of the present disclosure.

FIG. 16 is a sectional view of a backlight unit according to an eleventh embodiment of the present disclosure. Referring to FIG. 16, a backlight unit 900 includes a housing 720, a light diffusing member 610, a circuit board 120, light emitting diode chips 130, reflective members 140, and a reflective sheet 910.

The reflective sheet 910 is disposed on the upper surface of the circuit board 120 between multiple light emitting diode chips 130. The reflective sheet 910 may reflect light emitted from the light emitting diode chips 130 towards the housing 720 such that the reflected light can enter the light diffusing member 610. In addition, the reflective sheet 910 may reflect light emitted through the lower surface of the light diffusing member 610 such that the reflected light can reenter the light diffusing member 610. Accordingly, the backlight unit 900 according to this embodiment can improve luminous efficacy by the reflective sheet 910.

Although the reflective sheet 910 is illustrated as being disposed on the upper surface of the circuit board 120 in this embodiment, it should be understood that the location of the reflective sheet 910 is not limited thereto. For the circuit board 120 that is formed of a light transmitting glass substrate, the reflective sheet 910 may be disposed on a lower surface of the circuit board 120. In a structure where the reflective sheet 910 is disposed inside the housing 720, the housing 720 may be formed of a non-reflective material or the reflective material coated on the inner wall of the housing can be omitted.

Figure 17:
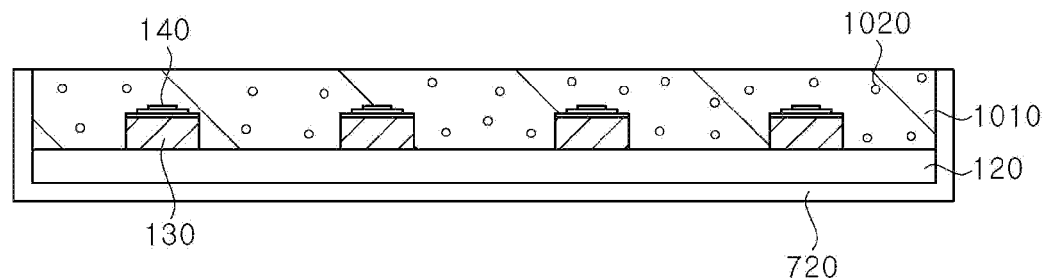
FIG. 17 is a sectional view of a backlight unit according to a twelfth embodiment of the present disclosure.

FIG. 17 is a sectional view of a backlight unit according to a twelfth embodiment of the present disclosure. Referring to FIG. 17, a backlight unit 1000 includes a housing 720, a light diffusing member 1010, a circuit board 120, light emitting diode chips 130, and reflective members 140.

According to this embodiment, the light diffusing member 1010 contains a light diffusing material 1020 dispersed therein. For example, the light diffusing material 1020 may include at least one selected from the group of glass, an acrylic compound, a Nylon-based compound, and a silicone compound.

In the backlight unit 1000 according to this embodiment, the light diffusing material 1020 is dispersed in the light diffusing member 1010, thereby improving uniformity of light emitted from the light diffusing member 1010.

Figure 18:
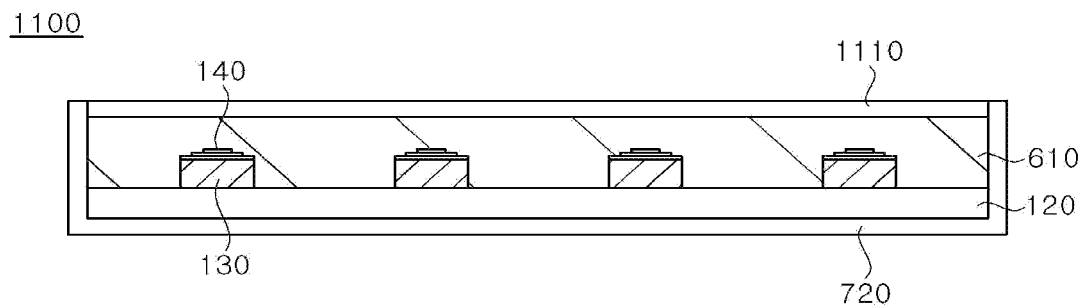
FIG. 18 is a sectional view of a backlight unit according to a thirteenth embodiment of the present disclosure.

FIG. 18 is a sectional view of a backlight unit according to a thirteenth embodiment of the present disclosure. Referring to FIG. 18, a backlight unit 1100 includes a light diffusing member 610, a circuit board 120, light emitting diode chips 130, reflective members 140, and a diffusion sheet 1110.

The backlight unit 1100 according to the eleventh embodiment is distinguished from the backlight unit according to the tenth embodiment in that a light diffusing component is disposed on the upper surface of the light diffusing member 610 instead of being disposed inside the light diffusing member 610.

The diffusion sheet 1110 is disposed on the upper surface of the light diffusing member 610. The diffusion sheet 1110 diffuses light to be emitted in a uniform distribution over a broad range upon reception of the light through the light diffusing member 610.

Accordingly, the backlight unit 1100 according to this embodiment can be improved in uniformity of light by the diffusion sheet 1110.

The backlight units according to the tenth and eleventh embodiments improves uniformity of light using the diffusion sheet or the light diffusing material dispersed in the light diffusing member. However, it should be understood that a component for diffusing light is not limited thereto. The backlight unit may include a light diffusing member having a light diffusing pattern on at least one of upper and lower surfaces thereof instead of the light diffusing material and the light diffusion sheet. In addition, the backlight unit may include at least two light diffusing components selected from among the light diffusing material dispersed in the light diffusing member, the light diffusing pattern and the light diffusion sheet formed on the surface of the light diffusing member.

Figure 19:
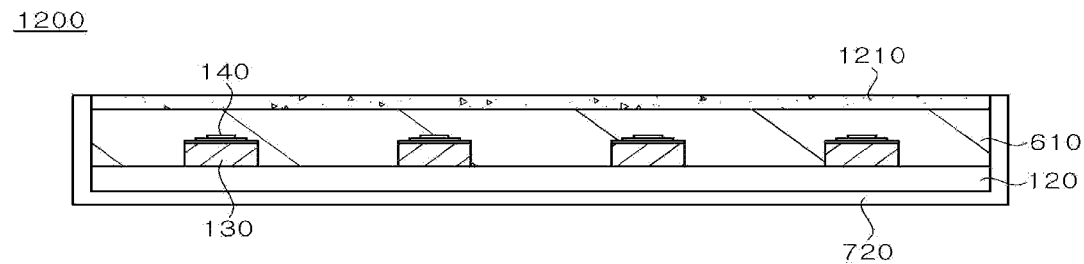
FIG. 19 is a sectional view of a backlight unit according to a fourteenth embodiment of the present disclosure.

FIG. 19 is a sectional view of a backlight unit according to a fourteenth embodiment of the present disclosure. Referring to FIG. 19, a backlight unit 1200 includes a housing 720, a light diffusing member 610, a circuit board 120, light emitting diode chips 130, reflective members 140, and a wavelength conversion sheet 1210.

In the backlight unit 1200, the wavelength conversion sheet 1210 is disposed on an upper surface of the light diffusing member 610. The wavelength conversion sheet 1210 emits white light or certain color light through conversion of wavelengths of light emitted from the light diffusing member 610. The wavelength conversion sheet 1210 disposed on the light diffusing member 610 enables omission of the wavelength conversion member formed on each of the light emitting diode chips 130.

The backlight units according to the eleventh to fourteenth embodiments include at least one of the diffusion sheet, the reflective sheet or the wavelength conversion sheet disposed on the housing. However, it should be understood that the backlight unit according to the present disclosure is not limited thereto. The backlight unit according to embodiments of the present disclosure may include at least two optical sheets selected from the group of the diffusion sheet, the reflective sheet and the wavelength conversion sheet. In addition, the backlight unit according to embodiments of the present disclosure may further include various optical sheets, such as a prism sheet, a polarization sheet, and the like in addition to the diffusion sheet, the reflective sheet and the wavelength conversion sheet.

In addition, the light diffusing material, the light diffusing pattern and the optical sheet of the backlight units according to the ninth through the fourteenth embodiments may be identically applied to the backlight units according to the first to eighth embodiments.

The backlight unit according to this embodiment can efficiently improve uniformity of light using the light diffusing material, the light diffusing pattern and the optical sheet.

Figure 20:
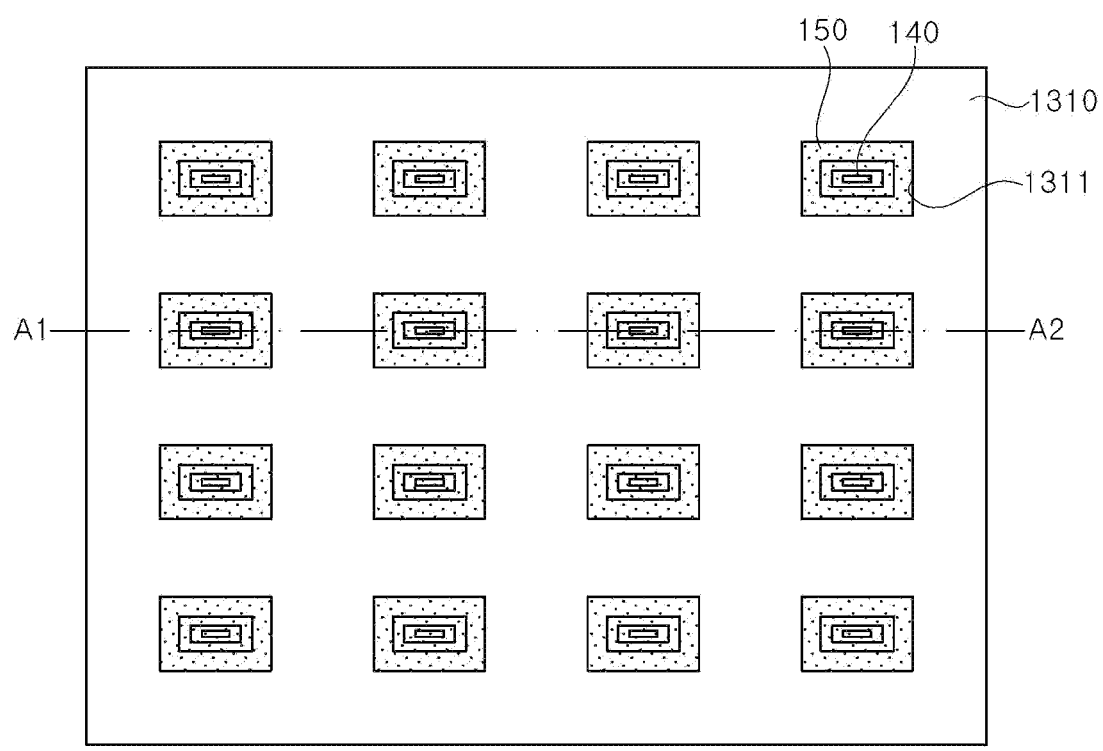
FIG. 20 is an exemplary plan view of a backlight unit according to a fifteenth embodiment of the present disclosure.
Figure 21:
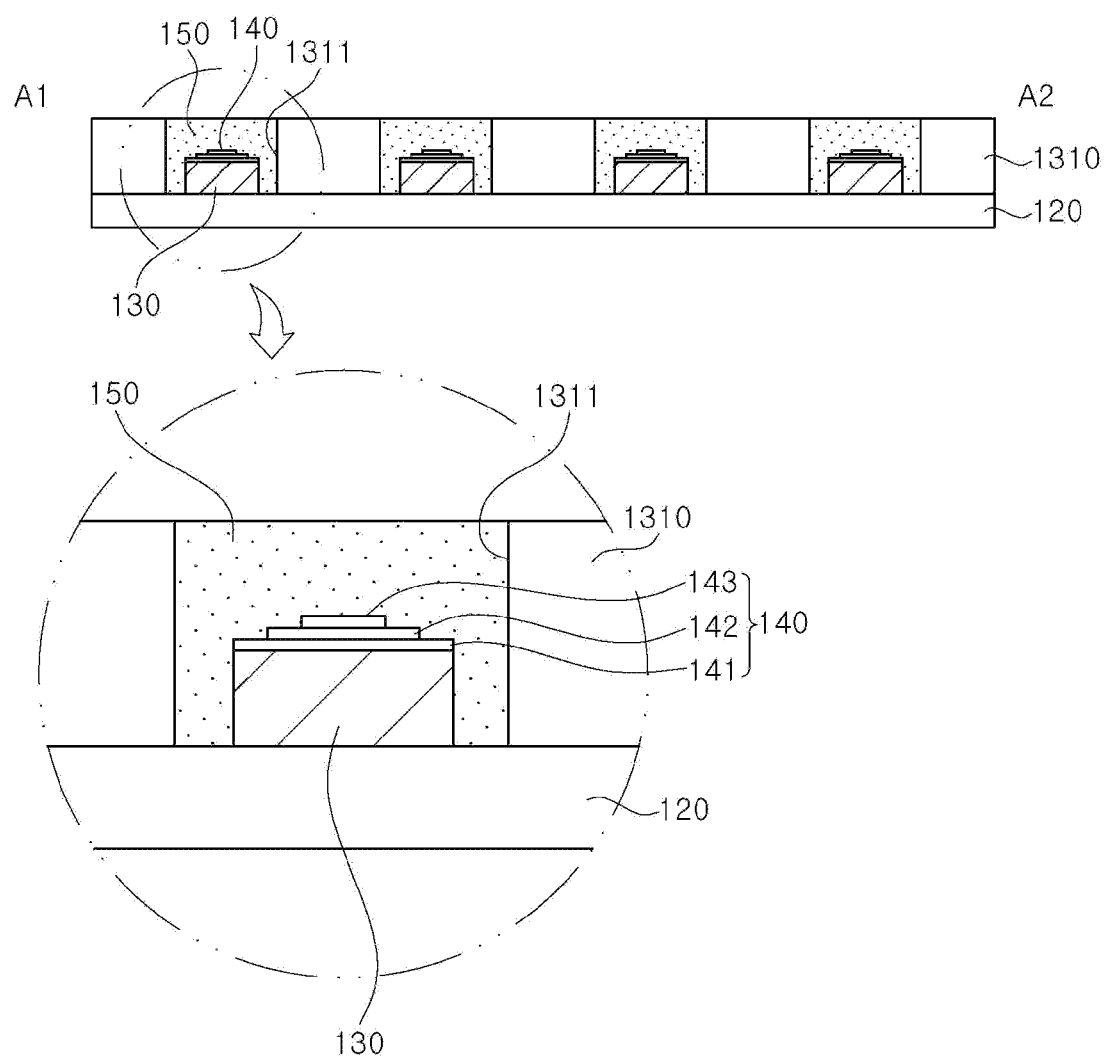
FIG. 21 is an exemplary cross sectional view of the backlight unit as shown in FIG. 21.

FIG. 20 and FIG. 21 are exemplary views of a backlight unit according to a fifteenth embodiment of the present disclosure. FIG. 20 is a schematic plan view of a backlight unit 1300 according to a fifteenth embodiment of the present disclosure. FIG. 21 is a cross-sectional view of FIG. 20 along the A1 to A2 line.

Referring to FIG. 20, the backlight unit 1300 includes a light diffusing member 1310, a circuit board 120, light emitting diode chips 130, reflective members 140, and sealing members 150.

The light diffusing member 1310 is formed of a transparent material. For example, the light diffusing member 1310 may include one material selected from among acrylic resins, such as poly(methyl methacrylate) (PMMA), polyethylene terephthalate (PET), polycarbonate (PC), and polyethylene naphthalate (PEN) resins. According to this embodiment, the light diffusing member 1310 has at least one opening 1311 formed through upper and lower surfaces thereof. Multiple openings are arranged at constant intervals over the light diffusing member 1310.

Each of the openings 1311 of the light diffusing member 1310 receives the light emitting diode chip 130 and the reflective member 140 disposed on an upper surface of the light emitting diode chip 130. That is, a height of an upper surface of the light diffusing member 1310 is collinear with or higher than an upper surface of the reflective member 140.

Although not illustrated in this embodiment, the backlight unit 1300 includes optical sheets disposed on the light diffusing member 1310 to diffuse or collect light.

The light diffusing member 1310 is provided at a lower side thereof with the circuit board 120 on which the light emitting diode chips 130 are mounted. The circuit board 120 is electrically connected to the light emitting diode chips 130 to supply electric power to the light emitting diode chips 130 such that the light emitting diode chips 130 emit light.

The light emitting diode chip 130 is mounted on the circuit board 120 so as to be disposed in the opening 1311 of the light diffusing member 1310. In the structure where the light diffusing member 1310 is formed with the multiple openings 1311, the light emitting diode chip 130 is disposed in each of the openings 1311.

According to this embodiment, the light emitting diode chip 130 is configured to emit light through the upper and side surfaces thereof. The structure of the light emitting diode chip 130 will be described in detail below.

The side surface of the light emitting diode chip 130 faces an inner wall of the opening 1311 of the light diffusing member 1310. Accordingly, light emitted through the side surface of the light emitting diode chip 130 is incident on the inner wall of the opening 1311 of the light diffusing member 1310. That is, the inner wall of the opening 1311 of the light diffusing member 1310 is a light incident surface on which light is incident. Here, light emitted through the side surface of the light emitting diode chip 130 means light generated from the active layer (not shown) of the light emitting diode chip 130 and having passed through the side surface of the light emitting diode chip 130.

An upper surface of the light emitting diode chip 130 is formed with the reflective member 140 constituted by a single layer or multiple layers. For example, first to third reflective members 141 to 143 are sequentially stacked on the upper surface of the light emitting diode chip 130.

According to this embodiment, the second reflective member 142 having a smaller area than the first reflective member 141 is disposed on an upper surface of the first reflective member 141. For example, the first reflective member 141 may be formed to cover the entirety of the upper surface of the light emitting diode chip 130. Here, the second reflective member 142 is disposed in a region of the first reflective member 141. Further, the third reflective member 143 having a smaller area than the second reflective member 142 is disposed on an upper surface of the second reflective member 142. Here, the third reflective member 143 is disposed in a region of the second reflective member 142.

With this structure, the first to third reflective members 141 to 143 can reflect some fraction of light emitted through the upper surface of the light emitting diode chip 130 such that the reflected light can travel towards the inner wall of the opening 1311 of the light diffusing member 1310. Here, light emitted through the upper surface of the light emitting diode chip 130 means light generated from the active layer (not shown) of the light emitting diode chip 130 and having passed through the upper surface of the light emitting diode chip 130. Accordingly, the inner wall of the opening 1311 of the light diffusing member 1310 receives light emitted through the side surface of the light emitting diode chip 130 and light reflected by the first to third reflective members 141 to 143.

The first to third reflective members 141 to 143 may have different reflectivity depending upon materials, thicknesses and areas thereof. Accordingly, the quantity of light traveling towards the inner wall of the opening 1311 of the light diffusing member 1310 may be regulated through regulation of reflectivity of the first to third reflective members 141 to 143. Furthermore, the ratio of light emitted through the upper surface of the light diffusing member 1310 after passing through the light diffusing member 1310 to light emitted through the openings of the light diffusing member 1310 after passing through the light diffusing member 1310 may be regulated by regulating reflectivity of each of the first to third reflective members 141 to 143. For example, the backlight unit 1300 according to this embodiment can make the quantity of light emitted through the upper surface of the light diffusing member 1310 and the quantity of light emitted through the openings 1311 of the light diffusing member 1310 become uniform through the first to third reflective members 141 to 143. That is, the backlight unit 1300 according to this embodiment can improve uniformity of light emitted through the entirety of the light exit surface.

The first to third reflective members 141 to 143 may be formed of any material capable of reflecting at least some fraction of light. Each of the first to third reflective members 141 to 143 may be a distributed Bragg reflector (DBR). For example, the DBR may be constituted by a single layer formed of one of $SiO_2$, $TiO_2$, SiN, and TiN. Alternatively, the DBR may have a structure wherein at least two layers of $SiO_2$, $TiO_2$, SiN and TiN are stacked once or repeatedly one above another. Alternatively, the first to third reflective members 141 to 143 may be formed of a metal, such as Ag, Al, and the like. Alternatively, some of the first to third reflective members 141 to 143 may be formed of a metal and the other reflective member may be constituted by the DBR. Although the reflective member is illustrated as having a triple-layer structure in this embodiment, it should be understood that the number of reflective members may be changed according to thickness, material and luminous quantity of the reflective member.

The sealing member 150 may fill the opening 1311 of the light diffusing member 1310 to cover the light emitting diode chip 130. Here, an upper surface of the sealing member 150 may be collinear with the upper surface of the light diffusing member 1310.

The sealing member 150 surrounds the light emitting diode chip 130 and thus can protect the light emitting diode chip 130 from foreign matter, such as moisture, dust, and the like. In addition, the sealing member 150 can protect the light emitting diode chip 130 from external impact. The sealing member 150 may be formed of a light transmitting material well-known in the art, such as a silicone resin, an epoxy resin, and the like. Furthermore, the sealing member 150 may be formed of a material having a similar refractive index to the light diffusing member 1310. That is, the sealing member 150 may be formed of a light transmitting material having a refractive index that is 10% or less of the refractive index of the light diffusing member 1310. For example, the light diffusing member 1310 may be formed of polymethyl methacrylate (PMMA) having a refractive index of about 1.49. Here, the sealing member 150 may be formed of a light transmitting silicone resin having a refractive index of about 1.4 to about 1.6. The sealing member 150 having a similar refractive index to the light diffusing member 1310 can minimize reflection of light traveling towards the light diffusing member 1310 at the interface between the light diffusing member 1310 and the sealing member 150.

For example, the light diffusing member 1310 may be formed by injection molding. The light diffusing member 1310 may be formed by injecting a material for the light diffusing member into a mold designed to have the openings 1311 formed through the light diffusing member. The injection molded light diffusing member 1310 is disposed on the circuit board 120 such that the light emitting diode chips 130 are placed in the openings 1311, respectively. Then, the openings 1311 are filled with the sealing members 150, thereby forming the backlight unit 1300. The method for manufacturing the backlight unit 1300 is not limited thereto and the backlight unit 1300 may be manufactured in various ways.

Since the light emitting diode chips are arranged along the side surface of the light diffusing member in the conventional edge type backlight unit, the conventional edge type backlight unit has a limit in thickness reduction of the display device. Moreover, since the multiple light emitting diode chips mounted on the circuit board are generally connected in series, the edge type backlight unit does not allow individual operation of the light emitting diode chips.

Moreover, since the light emitting diode chips are disposed under the light diffusing member in a conventional direct type backlight unit, the direct type backlight unit has a limit in thickness reduction of the backlight unit and the display device.

However, in the backlight unit 1300 according to this embodiment, the light emitting diode chips 130 are disposed in the openings 1311 inside the light diffusing member 1310 instead of being disposed under the light diffusing member 1310, thereby reducing the thickness of the backlight unit 1300 and the display device. In addition, the backlight unit 1300 according to this embodiment can realize local dimming to allow individual control of the light emitting diode chips 130 through the circuit board 120. Further, in the backlight unit 1300 according to this embodiment, reflectivity of the reflective member 140 may be easily controlled based on the size of the reflective member 140, the number of layers in the reflective member 140, the material of the reflective member 140, and the like. Accordingly, the backlight unit 1300 according to this embodiment can improve uniformity of light emitted through the upper surface of the light diffusing member 1310 and light emitted through an upper portion of the openings 1310. Furthermore, the backlight unit 1300 can emit uniform light, thereby minimizing generation of spots in a display device (not shown) including the backlight unit 1300.

Figure 22:
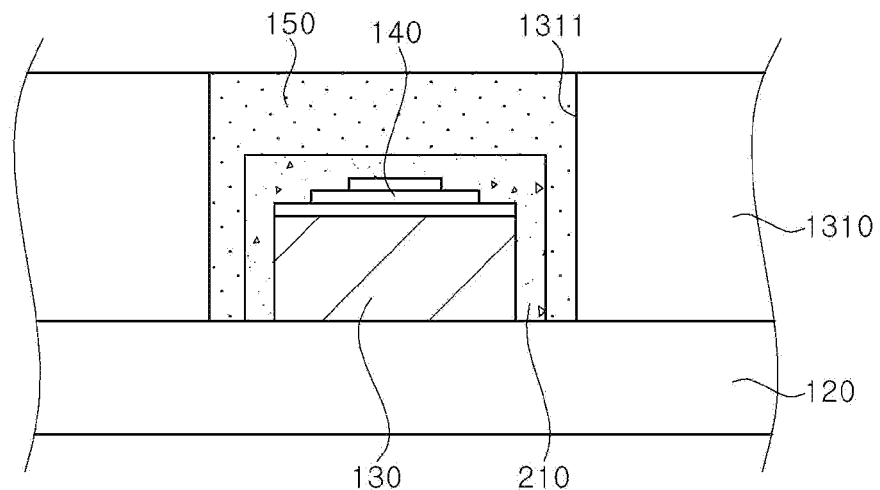
FIG. 22 is a sectional view of a backlight unit according to a sixteenth embodiment of the present disclosure.

FIG. 22 is a sectional view of a backlight unit according to a sixteenth embodiment of the present disclosure. Referring to FIG. 22, a backlight unit 1400 includes a light diffusing member 1310, a circuit board 120, light emitting diode chips 130, reflective members 140, wavelength conversion members 210, and sealing members 150.

Among components of the backlight unit 1400, the circuit board 120, the light emitting diode chips 130, the reflective members 140 and the sealing members 150 are described in the above embodiments. Thus, repeated description of the same components as those of the above embodiments will be omitted.

The backlight unit 1400 according to this embodiment includes the wavelength conversion member 210 that surrounds the light emitting diode chip 130 and the reflective member 140. Each of the sealing member 150 fills an opening 1311 of the light diffusing member 1310 so as to surround the wavelength conversion member 210 therein.

The wavelength conversion member 210 emits white light or certain color light through conversion of wavelengths of light emitted from the light emitting diode chip 130.

The wavelength conversion member 210 may be formed of a transparent resin containing phosphors capable of converting the wavelengths of light. For example, the transparent resin may be a transparent silicone resin. The phosphors may include yellow phosphors, red phosphors, and green phosphors.

Examples of the yellow phosphors may include silicate phosphors or YAG:Ce ($T_3Al_5O_{12}$:Ce) phosphors, which are cerium-doped yttrium (Y) aluminum (Al) garnets having a main wavelength of 530 nm to 570 nm.

Examples of the red (R) phosphors may include nitride phosphors or YOX ($Y_2O_3$:Eu) phosphors having a main wavelength of 611 nm and composed of a compound of yttrium oxide ($Y_2O_3$) and europium (Eu).

An example of the green (G) phosphors may include LAP ($LaPO_4$:Ce,Tb) phosphors having a main wavelength of 544 nm and composed of a compound of phosphoric acid ($PO_4$), lanthanum (La) and terbium (Tb).

An example of the blue (B) phosphors may include BAM ($BaMgAl_{10}O_{17}$:Eu) phosphors having a main wavelength of 450 nm and composed of a compound of barium (Ba), magnesium (Mg) and aluminum oxide materials and europium (EU).

The phosphors may include fluoride compound KSF ($K_2SiF_6$) phosphors, which are $Mn^{4+}$-activated phosphors advantageous for high color reproduction.

As such, the wavelengths of light emitted from the side surface of the light emitting diode chip 130 and light having passed through the reflective member 140 can be converted by the wavelength conversion member 210 formed to surround the light emitting diode chip 130 and the reflective member 140.

Figure 23:
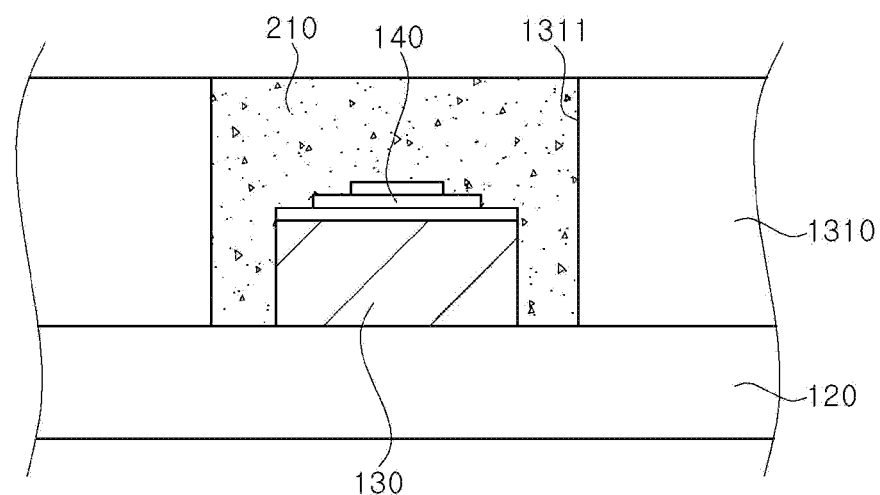
FIG. 23 is a sectional view of a backlight unit according to a seventeenth embodiment of the present disclosure.

FIG. 23 is a sectional view of a backlight unit according to a seventeenth embodiment of the present disclosure.

Referring to FIG. 23, a backlight unit 1500 includes a light diffusing member 1310, a circuit board 120, light emitting diode chips 130, reflective members 140, and wavelength conversion members 210.

In this embodiment, the wavelength conversion members 210 act as sealing members for protection of the light emitting diode chips 130 while converting wavelengths of light. The wavelength conversion member 210 is formed of a transparent resin acting as the sealing member and containing phosphors for converting the wavelengths of light.

As such, the backlight unit 1500 allows omission of the sealing members, thereby providing a simple structure while reducing manufacturing costs.

Figure 24:
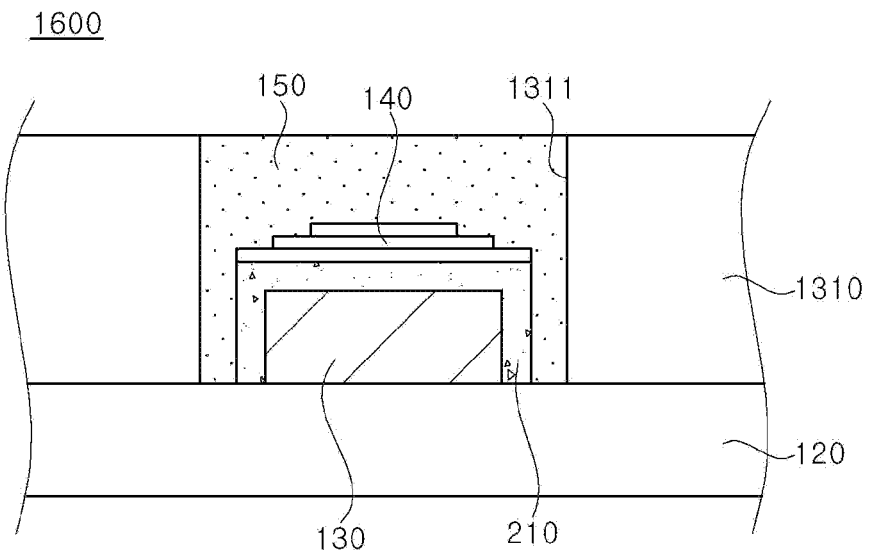
FIG. 24 is a sectional view of a backlight unit according to a eighteenth embodiment of the present disclosure.

FIG. 24 is a sectional view of a backlight unit according to an eighteenth embodiment of the present disclosure. Referring to FIG. 24, a backlight unit 1600 includes a light diffusing member 1310, a circuit board 120, light emitting diode chips 130, reflective members 140, wavelength conversion members 210, and sealing members 150.

The backlight unit 1600 according to this embodiment includes the wavelength conversion members 210 each surrounding the light emitting diode chip 130.

In this embodiment, the wavelength conversion member 210 is formed to surround side and upper surfaces of the light emitting diode chip 130. Here, the lowermost layer of the reflective member 140 may be formed to cover the entirety of an upper surface of the wavelength conversion member 210.

Light emitted through the side surface of the light emitting diode chip 130 is subjected to wavelength conversion and is directed to the light diffusing member 1310. Further, light emitted through the upper surface of the light emitting diode chip 130 is subjected to wavelength conversion and is directed to the reflective member 140 through wavelength conversion. That is, since light reflected by the reflective member 140 is subjected to wavelength conversion on the upper surface of the light emitting diode chip 130, it is not necessary to perform wavelength conversion of the light on the side surface of the light emitting diode chip 130. Thus, since there is no need for consideration of light reflection by the reflective member 140 for the wavelength conversion member 210 on the side surface of the light emitting diode chip 130, there is no need to increase the content of the phosphors or for increase in thickness of the wavelength conversion member. That is, the wavelength conversion member 210 can achieve uniform wavelength conversion through regulation of upper and side thicknesses thereof in consideration of only the light emitted through the upper and side surfaces of the light emitting diode chip 130.

Figure 25:
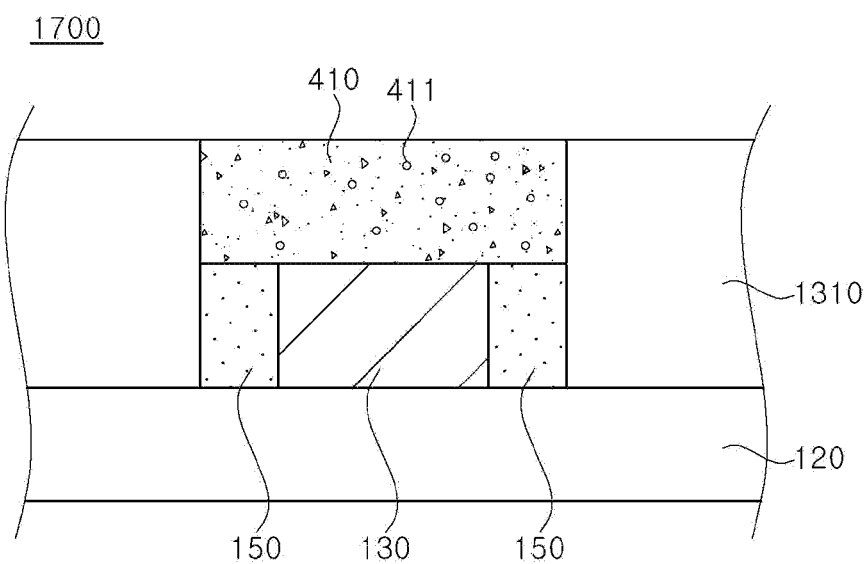
FIG. 25 is a sectional view of a backlight unit according to a nineteenth embodiment of the present disclosure.

FIG. 25 is a sectional view of a backlight unit according to a nineteenth embodiment of the present disclosure. Referring to FIG. 25, the backlight unit 1700 includes a light diffusing member 1310, a circuit board 120, light emitting diode chips 130, reflective members 410, and sealing members 150.

According to this embodiment, the reflective member 410 may be formed of a light transmitting resin containing a reflective material 411. The light transmitting resin of the reflective member 410 may be selected from well-known materials in the art, such as a silicone resin, an epoxy resin, and the like. Further, the light transmitting resin of the reflective member 410 may be formed of a material having a similar refractive index to the light diffusing member 1310 in order to minimize reflection of light due to difference in refractive index at an interface of the light diffusing member

1310. For example, the light transmitting resin of the reflective member 410 may be a silicone resin having a reflectivity difference of 10% or less with the light diffusing member 1310.

The sealing member 150 fills only a space between the side surface of the light emitting diode chip 130 and the inner wall of the light diffusing member 1310. Here, the upper surface of the sealing member 150 is collinear with the upper surface of the light emitting diode chip 130.

The reflective member 410 is disposed on the upper surface of the light emitting diode chip 130 and the upper surface of the sealing member 150, and is formed to fill an opening 1311 of the light diffusing member 1310. Thus, light emitted through the upper surface of the light emitting diode chip 130 is reflected by the reflective material 411 to enter the inner wall of the light diffusing member 1310 while passing through the light transmitting resin.

Although the upper surface of the sealing member 150 is illustrated as being collinear with the upper surface of the light emitting diode chip 130 in this embodiment, it should be understood that the structure of this embodiment is not limited thereto. For example, the reflective member 410 may be placed only on the upper surface of the light emitting diode chip 130. Alternatively, the sealing member 150 may be formed to fill a space between the side surfaces of the light emitting diode chip 130 and the reflective member 410 and the light diffusing member 1310. In addition, the sealing member 150 and the reflective member 410 may further contain phosphors for conversion of wavelengths of light.

According to this embodiment, the reflective member 410 allows control of the quantity of light emitted through the upper surface of the light emitting diode chip 130 or reflected to the side surface thereof by regulating the content of the reflective material 411. That is, the backlight unit 1700 according to this embodiment allows easy control of the quantity of light emitted through the upper surface of the light diffusing member 1310 and through the openings 1310 of the light diffusing member 1310 only through regulation of the content of the reflective material 411 in the reflective member 410.

Figure 26:
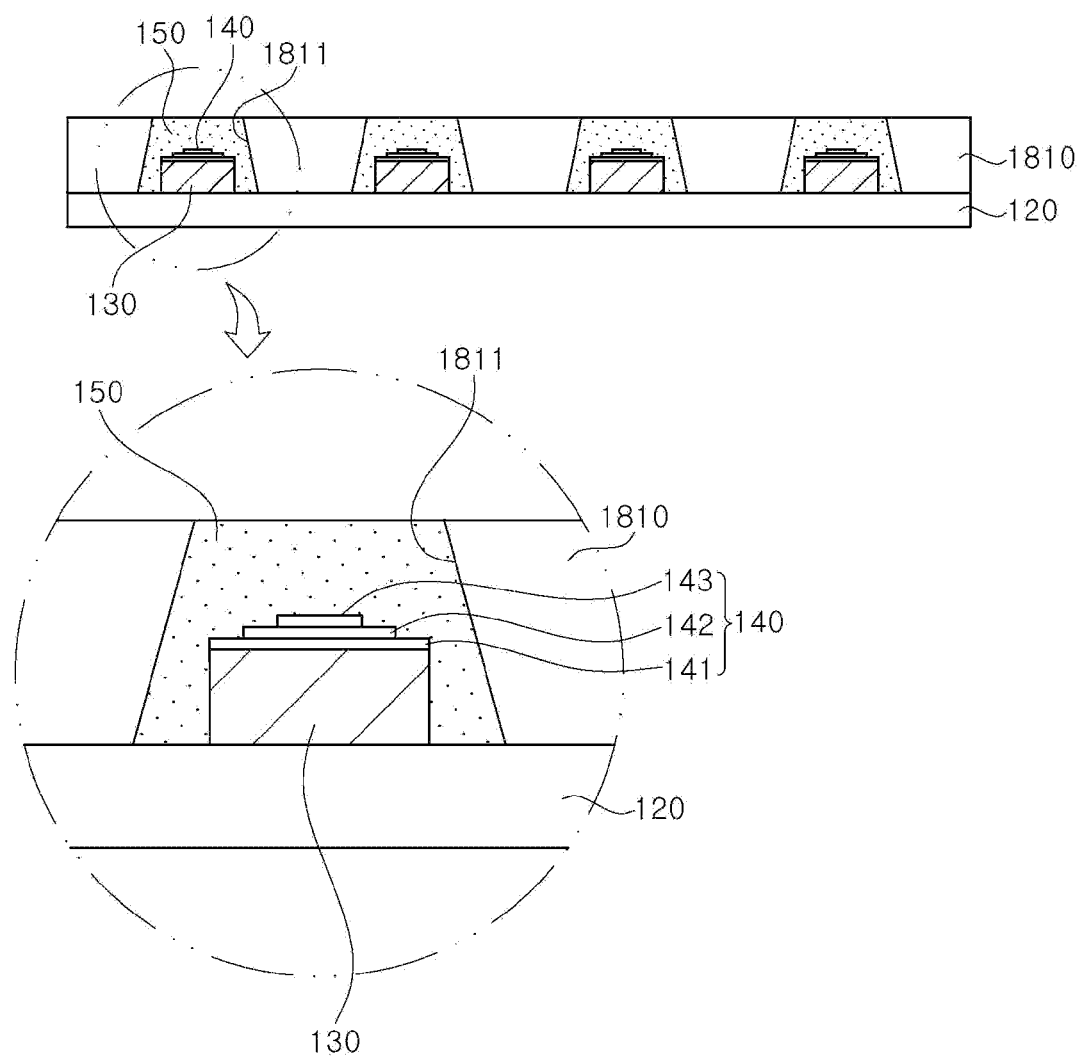
FIG. 26 is a sectional view of a backlight unit according to a twentieth embodiment of the present disclosure.

FIG. 26 is a sectional view of a backlight unit according to a twentieth embodiment of the present disclosure. Referring to FIG. 26, a backlight unit 1800 includes a light diffusing member 1810, a circuit board 120, light emitting diode chips 130, reflective members 140, and sealing members 150.

According to this embodiment, each of openings 1811 of the light diffusing member 1810 has a width gradually decreasing in an upward direction. That is, as shown in FIG. 26, an inner wall of the opening 1811 of the light diffusing member 1810 is inclined towards the light emitting diode chip 130 from a lower portion to an upper portion thereof. As such, since the light diffusing member 1810 has an inclined inner wall, the inner wall of the light diffusing member 1810 has an increased area. That is, the light incident surface on which light is incident has a large area. Accordingly, with increase in light incident area of the light diffusing member 1810, the light diffusing member 1810 has improved light incidence efficiency.

According to this embodiment, as light incidence efficiency of the light diffusing member 1810 improves, the backlight unit 1800 may improve light utilization efficiency.

Although some embodiments have been described herein with reference to the accompanying drawings, it should be understood that these embodiments are provided for illustration only and are not to be construed in any way as limiting the present disclosure. Therefore, it should be understood that the scope of the present disclosure should be defined by the appended claims and equivalents thereto.

What is claimed is:

1. A backlight unit comprising:
    a circuit board;
    at least one light emitting diode chip disposed on the circuit board;
    at least one reflector disposed on the light emitting diode chip; and
    at least one light diffuser covering the light emitting diode chip and the reflector,
    wherein the light diffuser comprises a cavity corresponding to the light emitting diode chip and the reflector disposed inside the light diffuser,
    the light emitting diode chip comprising:
        a substrate;
        a light emitting structure disposed at a lower side of the substrate;
        a transparent electrode layer disposed at a lower surface of the light emitting structure;
        a first electrode pad electrically connected to a first conductivity type semiconductor layer of the light emitting structure;
        a second electrode pad electrically connected to a second conductivity type semiconductor layer of the light emitting structure; and
        a reflective layer formed to cover at least a portion of a lower side of the light emitting structure.

2. The backlight unit according to claim 1,
    wherein the reflector is a DBR (Distributed Bragg Reflector) comprising at least a first layer and a second layer, each of the first layer and the second layer including $SiO_2$, $TiO_2$, SiN, or TiN.

3. The backlight unit according to claim 1,
    wherein the reflector further comprises a first, a second and a third reflector to reflect at least a fraction of light emitted through un upper surface of the light emitting diode chip.

4. The backlight unit according to claim 1,
    wherein the light diffuser comprises a transparent material.

5. The backlight unit according to claim 1,
    wherein the light diffuser comprises a convex portion on an upper surface of thereof.

6. The backlight unit according to claim 5,
    wherein the convex portion protrudes in an upward direction.

7. The backlight unit according to claim 1,
    wherein the light diffuser has a semispherical structure.

8. The backlight unit according to claim 1,
    wherein the light diffuser has a parabolic structure.

9. The backlight unit according to claim 8,
    wherein the parabolic structure has a greater height than a width in a cross-section thereof.

10. The backlight unit according to claim 5,
    wherein the convex portion has different radii of curvature along a light emission location of the convex portion.

11. The backlight unit according to claim 1,
    wherein a light exit surface of the light diffuser has a flat structure.

12. The backlight unit according to claim 1,
    wherein the reflective layer comprises an insulation layer including a single layer or multilayer DBR.

13. The backlight unit according to claim 1,
further comprising a housing which is open at an upper side thereof and contains the circuit board, the light emitting diode chip, the reflector and the light diffuser therein.

14. The backlight unit according to claim 1,
further comprising a wavelength conversion sheet disposed on the light diffuser.

15. The backlight unit according to claim 14,
wherein the wavelength conversion sheet converts wavelengths of light emitted from the light diffuser and emits white light.

16. The backlight unit according to claim 1, wherein the reflector is a DBR (Distributed Bragg Reflector) comprising at least one set of two different layers, each layer including $SiO_2$, $TiO_2$, SiN, or TiN; and
the set of two different layers are stacked once or repeatedly on or above another set of two different layers.

17. The backlight unit according to claim 2, wherein the DBR further comprises a third layer including $SiO_2$, $TiO_2$, SiN, or TiN; and
the first and the second layers are stacked once or repeatedly on or above another set of the first and the second layers.

18. The backlight unit according to claim 17, wherein another set of the first and the second layers further includes the third layer.

* * * * *